US012616060B2

(12) United States Patent
Sharma et al.

(10) Patent No.: US 12,616,060 B2
(45) Date of Patent: Apr. 28, 2026

(54) STACKED RANDOM-ACCESS MEMORY DEVICES WITH REFRIGERATION

(71) Applicant: Intel Corporation, Santa Clara, CA (US)

(72) Inventors: Abhishek A. Sharma, Hillsboro, OR (US); Tahir Ghani, Portland, OR (US); Anand S. Murthy, Portland, OR (US); Wilfred Gomes, Portland, OR (US); Sagar Suthram, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 917 days.

(21) Appl. No.: 17/680,368

(22) Filed: Feb. 25, 2022

(65) Prior Publication Data

US 2023/0275067 A1    Aug. 31, 2023

(51) Int. Cl.
*H01L 25/065* (2023.01)
*H01L 23/38* (2006.01)
*H01L 23/473* (2006.01)
*H01L 25/18* (2023.01)

(52) U.S. Cl.
CPC .......... *H01L 25/0657* (2013.01); *H01L 23/38* (2013.01); *H01L 23/473* (2013.01); *H01L 25/18* (2013.01); *H01L 2225/06589* (2013.01)

(58) Field of Classification Search
CPC ... H01L 25/0657; H01L 23/38; H01L 23/473; H01L 25/18; H01L 2225/06589; H01L 2225/06513; H01L 2225/06555; H01L 23/3677
See application file for complete search history.

(56) References Cited

U.S. PATENT DOCUMENTS

2021/0022266 A1* 1/2021 Shaikh ...................... G06F 1/20
2021/0043573 A1* 2/2021 Eid .......................... H01L 25/18
2022/0028842 A1* 1/2022 Chang ................... H01L 23/367

* cited by examiner

*Primary Examiner* — Evan G Clinton
*Assistant Examiner* — Corbyn D Mellinger
(74) *Attorney, Agent, or Firm* — Akona IP PC

(57) ABSTRACT

Described herein are memory devices that include a cooling structure for cooling one or more memory arrays. The memory arrays may be static random access memory (SRAM) arrays formed in multiple layers as a stacked memory device. The cooling structure may cool one or more layers of an SRAM device. For example, a cooling structure may be formed around the SRAM device and coupled to a cooling device. Alternatively, a cooling layer may be included in a memory device and coupled to one or more thermal interface layers in thermal contact with a memory layer by cold vias. The cold vias transfer a cold temperature from the cooling layer to the thermal interface layer to cool the thermal interface layer and, in turn, the memory arrays.

20 Claims, 15 Drawing Sheets

700

| Memory Cells 710a | Col I/O 730a | Memory Cells 710b |
| Row Decoder 720a | Control 740 | Row Decoder 720b |
| Memory Cells 710c | Col I/O 730b | Memory Cells 710d | y x

1500

SEE FIG. 10B

1502

1502

1800

| PROCESSING DEVICE 1802 | MEMORY 1804 |
| COMMUNICATION CHIP 1806 | ANTENNA 1808 |
| BATTERY/POWER CIRCUITRY 1810 | DISPLAY DEVICE 1812 |
| AUDIO OUTPUT DEVICE 1814 | AUDIO INPUT DEVICE 1816 |
| OTHER OUTPUT DEVICE 1818 | OTHER INPUT DEVICE 1820 |
| GPS DEVICE 1822 | SECURITY INTERFACE DEVICE 1824 |
| TEMPERATURE DETECTION DEVICE 1826 | TEMPERATURE REGULATION DEVICE 1828 |

1900

| LOGIC 1902 | MEMORY 1904 |
| COMMUNICATION DEVICE 1906 | INTERCONNECTS 1908 |
| TEMPERATURE DETECTION DEVICE 1910 | TEMPERATURE REGULATION DEVICE 1912 |
| BATTERY/POWER CIRCUITRY 1914 | HARDWARE SECURITY DEVICE 1916 |

STACKED RANDOM-ACCESS MEMORY DEVICES WITH REFRIGERATION

BACKGROUND

Embedded memory is important to the performance of modern system-on-a-chip (SoC) technology. Typically, memory assemblies (e.g., static random-access memory (SRAM) and dynamic random-access memory (DRAM)) include one or more memory arrays and control circuitry for the memory arrays in a single layer. Low power and high-density embedded memory is used in many different computer products and further improvements are always desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 10A and 1013 are top views of, respectively, a wafer and dies that may include one or more stacked memory devices with a cooling system in accordance with any of the embodiments disclosed herein.

DETAILED DESCRIPTION

Overview

Figure 1:
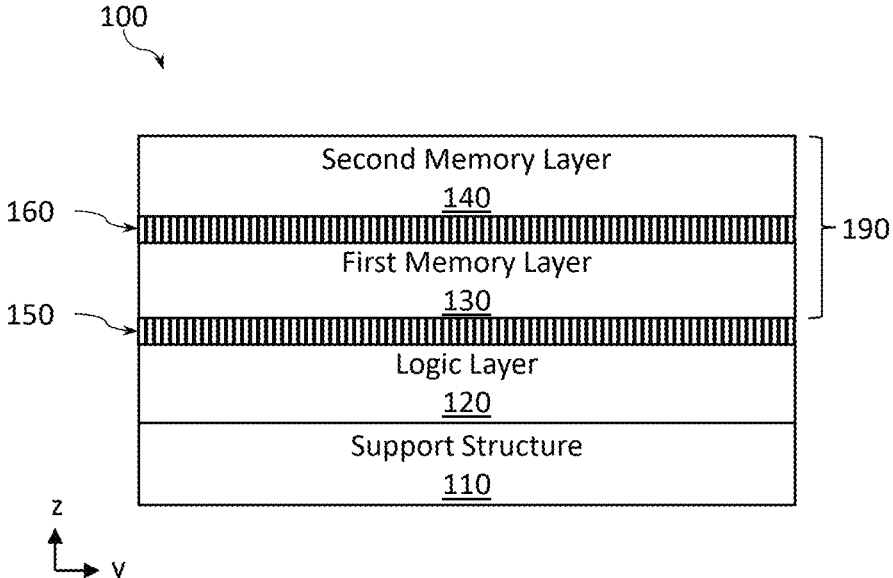
FIG. 1 provides a schematic illustration of an integrated circuit (IC) device with a logic layer and multiple layers of memory, according to some embodiments of the present disclosure.

Some memory devices may be considered "standalone" devices in that they are included in a chip that does not also include compute logic (where, as used herein, the term "compute logic devices" or simply "compute logic" or "logic devices," refers to devices, e.g., transistors, for performing computing/processing operations). Other memory devices may be included in a chip along with compute logic and may be referred to as "embedded" memory devices. Using embedded memory to support compute logic may improve performance by bringing the memory and the compute logic closer together and eliminating interfaces that increase latency. Various embodiments of the present disclosure relate to embedded memory arrays, as well as corresponding methods and devices.

Some embodiments of the present disclosure may refer to SRAM and in particular, embedded SRAM (eSRAM). In general, memory cells/arrays described herein may be implemented as standalone SRAM devices, eSRAM devices, non-volatile SRAM devices, or other volatile or non-volatile memory cells/arrays.

An SRAM memory cell includes a plurality of transistors for storing a bit value or a memory state (e.g., logic "1" or "0") of the cell, and one or more access transistors for controlling access to the cell (e.g., access to write information to the cell or access to read information from the cell). A typical SRAM memory cell is made up of 6 transistors and is, therefore, may be referred to as a "6T SRAM memory cell," where 4 transistors are used to store a bit value and 2 transistors are access transistors, coupled to a bitline (BL) and a wordline (WL). Various SRAM memory cells have, conventionally, been implemented with transistors being front end of line (FEOL), logic-process based, transistors implemented in an upper-most layer of a semiconductor substrate.

One challenge in SRAM cells resides in that, given a usable surface area of a substrate, there are only so many FEOL transistors that can be formed in that area, placing a significant limitation on the density of memory cells incorporating such transistors. In conventional solutions, attempts to increase memory density have included decreasing the critical dimensions of the memory cells, which requires ever-increasing process complexity and cost, resulting in diminishing returns and expected slow pace of memory scaling for future nodes.

In SRAM devices, a portion of the surface area of the substrate is used for peripheral circuitry, e.g., circuitry for controlling the memory cells. Peripheral circuitry may include input/output (I/O) circuitry, mid-logic, repeaters, self-test circuitry, and voltage regulation circuitry. This peripheral circuitry constrains the surface area that can be devoted to memory cells. In addition, fabricating the peripheral circuitry in the same layer as the memory cells may add complexity and cost to the process. For example, I/O circuitry often operates at a higher voltage than the memory cells, and thus the I/O transistors have a longer channel length and thicker gate dielectric than the channel length and gate dielectric of transistors in the memory cells (e.g., the access transistors in the DRAM cells or transistors M1-M6 in the SRAM cells). Therefore, I/O transistors are processed in a separate step from the memory cells. The processing of the peripheral circuitry can also put stress on the memory cells, which may lead to damage.

Embodiments of the present disclosure may improve on at least some of the challenges and issues described above by separating at least some of the peripheral circuitry of memory devices to a separate layer, providing a vertically-stacked memory design. As described herein, a memory device may include a first layer that includes peripheral circuitry, such as input and output circuitry, repeaters, voltage blocks, etc., and a second layer that includes one or more memory arrays. The first layer and second layer are coupled by vias that pass signals between the two layers. Some peripheral circuitry, such as mid-logic, may be included in the memory layer. In some embodiments, a single peripheral layer may support multiple layers with memory cells. In other embodiments, multiple peripheral layers may support one layer of memory cells, or multiple layers of memory cells. The memory devices disclosed herein enable greater flexibility for circuit designers and can enable greater memory density for a given surface area, by freeing up area that was previously devoted to peripheral circuitry and moving it to a second layer.

A further challenge with existing SRAM technology is heat regulation. In general, when transistors operate at lower temperatures, they have improved performance. For example, electron mobility in transistors improves at lower temperatures, which can lead to increased drive currents. In addition, transistors at lower temperatures generally experience lower leakage than transistors operating at higher temperatures. These factors can result in smoother memory operations when SRAM is at a lower temperature. For example, the voltage levels required for memory operations may be lower when SRAM is at lower temperatures, due to the increased drive current. Thus, an SRAM device at a lower temperature may have lower power consumption than if the SRAM device is at a higher temperature.

Another effect of lower temperature SRAM is that it increases the conductivity of the conductive components, which can increase the speed of memory operations. In general, the size of an SRAM array is limited at least in part by the time to access bits across the array. As the size of an SRAM array increases, the time to read or write data from the SRAM array increases. For example, current SRAM array sizes may be around 128×128 bits, with a maximum array size of about 1000×1000 bits. Increasing the size of current SRAM arrays further may lead to undesirable access speeds. Operating an SRAM array at a lower temperature can improve the speed of memory access across the array, which can allow for larger SRAM arrays, e.g., up to 5000× 5000 bits. Larger SRAM arrays provide greater memory density across a memory device, so that a device of a particular size or footprint can have greater overall memory capacity if larger memory arrays are used.

Embodiments of the present disclosure provide memory devices that include or are coupled to cooling devices for cooling one or more memory arrays within the memory devices. For example, a memory device includes a refrigeration device either coupled to the memory device or formed on the same package as the memory device. The refrigeration device is coupled to a cooling structure that surrounds at least a portion of the memory device, e.g., the sides and/or top of the memory device, which cools the components of the memory device. For example, the cooling structure may cool the SRAM arrays and/or peripheral devices within the memory device. This improves the performance of the memory arrays and/or other components, and can allow for memory designs with larger SRAM arrays, as described above.

As another example, a memory device includes one or more memory arrays in thermal contact with a thermal interface layer that is coupled to a cooling device. The thermal interface layer may be formed over or under a memory array, and is in thermal contact with the memory array. The thermal interface layer may be coupled to the cooling device by cold vias that transfer a cold temperature from the cooling device to the thermal interface layer, thus cooling the memory array(s) in thermal contact with the thermal interface layer. The cold vias may be conductors, e.g., copper, that extend through one or more other layers, e.g., another layer of memory arrays, or a layer of peripheral devices. In some embodiments, a memory device includes multiple thermal interface layers, e.g., two thermal interface layers on either side of a memory array to cool the memory array from both the top and the bottom, or multiple thermal interface layers interspersed between multiple layers of memory arrays.

In the following, some descriptions may refer to a particular S/D region or contact being either a source region/contact or a drain region/contact. However, unless specified otherwise, which region/contact of a transistor is considered to be a source region/contact and which region/contact is considered to be a drain region/contact is not important because, as is common in the field of FETs, designations of source and drain are often interchangeable. Therefore, descriptions of some illustrative embodiments of the source and drain regions/contacts provided herein are applicable to embodiments where the designation of source and drain regions/contacts may be reversed.

As used herein, the term "metal layer" may refer to a layer above a substrate or support structure that includes electrically conductive interconnect structures for providing electrical connectivity between different IC components. Metal layers described herein may also be referred to as "interconnect layers" to clearly indicate that these layers include electrically conductive interconnect structures which may but does not have to be metal.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. As used herein, a "logic state" (or, alternatively, a "state" or a "bit"

value) of a memory cell may refer to one of a finite number of states that the cell can have, e.g., logic states "1" and "0," each state represented by a different voltage of the capacitor of the cell, while "READ" and "WRITE" memory access or operations refer to, respectively, determining/sensing a logic state of a memory cell and programming/setting a logic state of a memory cell. If used, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 11A-11B, such a collection may be referred to herein without the letters, e.g., as "FIG. 11."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices with stacked memory devices as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Example IC with Stacked Memory Structure

FIG. 1 provides a schematic illustration of an IC device 100 with a logic layer and multiple layers of memory, according to some embodiments of the present disclosure. As shown in FIG. 1, in general, the IC device 100 may include a substrate 110, a logic layer 120, a first memory layer 130, and a second memory layer 140.

Implementations of the present disclosure may be formed or carried out on the support structure 110, which may be, e.g., a substrate, a die, a wafer or a chip. The support structure 110 may, e.g., be the wafer 1500 of FIG. 10A, discussed below, and may be, or be included in, a die, e.g., the singulated die 1502 of FIG. 10B, discussed below. The support structure 110 may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the support structure 110 may be a printed circuit board (PCB) substrate. Although a few examples of materials from which the substrate may be formed are described here, any material that may serve as a foundation upon which a semiconductor device implementing any of the stacked memory devices as described herein may be built falls within the spirit and scope of the present disclosure.

The first and second memory layers 130, 140 may, together, be seen as forming a memory structure 190. As such, the memory structure 190 may include various memory cells (e.g., SRAM cells, as described further herein) that are coupled to wordlines (WLs) (e.g., row selectors) and bitlines (BLs) (e.g., column selectors). The memory structure 190 further comprises peripheral devices for accessing, controlling, and testing the memory cells. As described herein, at least some of the peripheral devices may be in a different layer from at least some of the memory cells, e.g., the first memory layer 130 may be a peripheral device layer while the second memory layer 140 includes one or more arrays of memory cells (e.g., SRAM arrays), or vice versa. The logic layer 120 may be a compute logic layer that may include various logic layers, circuits, and devices (e.g., logic transistors) to drive and control a logic IC. For example, the logic layer 120 may include a central processing unit (CPU) and/or a graphics processing unit (GPU). In some embodiments, an IC with a stacked memory as described herein may omit the logic layer 120, e.g., the IC device may be a dedicated memory device rather than a device that includes both memory and computation circuitry.

In some embodiments, the compute logic layer 120 may be provided in a FEOL layer and in one or more lowest back end of line (BEOL) layers (i.e., in one or more BEOL layers which are closest to the support structure 110), while the first memory layer 130 and the second memory layer 140 may be seen as provided in respective BEOL layers. Various BEOL layers may be, or include, metal layers. Various metal layers of the BEOL may be used to interconnect the various inputs and outputs of the logic devices in the compute logic layer 120 and/or of the memory cells in the memory layers 130 and/or 140. In particular, these metal layers may connect to the interconnects 150 that couple the compute logic layer 120 and the first memory layer 130. Additional metal layers in the first memory layer 130 and second memory layer 140 connect to the interconnects 160 that couple the first memory layer 130 to the second memory layer 140. In some embodiments, a portion of the interconnects 150 may extend from the compute logic layer 120 through the first memory layer 130 into higher memory layers, e.g., the second memory layer 140, as the interconnects 160.

Generally speaking, each of the metal layers of the BEOL may include a via portion and a trench portion. The trench portion of a metal layer is configured for transferring signals and power along electrically conductive (e.g., metal) lines (also sometimes referred to as "trenches") extending in the x-y plane (e.g., in the x- or y-directions), while the via portion of a metal layer is configured for transferring signals and power through electrically conductive vias extending in the z-direction, e.g., to any of the adjacent metal layers above or below. Accordingly, vias connect metal structures (e.g., metal lines or vias) from one metal layer to metal structures of an adjacent metal layer. While referred to as "metal" layers, various layers of the BEOL may include only certain patterns of conductive metals, e.g., copper (Cu), aluminum (Al), Tungsten (W), or Cobalt (Co), or metal alloys, or more generally, patterns of an electrically conductive material, formed in an insulating medium such as an interlayer dielectric (ILD). The insulating medium may include any suitable ILD materials such as silicon oxide, carbon-doped silicon oxide, silicon carbide, silicon nitride, aluminum oxide, and/or silicon oxynitride.

The interconnects 150 and/or 160 may be formed using hybrid bonding. Hybrid bonding involves bonding dies with ICs formed thereon. The dies may be formed by different processes and then combined, thus achieving various functionalities (e.g., logic and memory) in the bonded combination. The interconnects 150 and/or 160 may include power vias for transferring power between layers and signal vias for transferring data signals between layers. In general, cross-sectional dimensions (e.g., diameters) and a pitch (e.g., defined as a center-to-center distance) of power vias are larger than cross-sectional dimensions and a pitch of signal vias. For example, in some embodiments, the pitch of the power vias extending through the bonding interface of the compute logic layer 120 and the first memory layer 130 may be between about 10 and 25 micron, e.g., between about 15 and 20 micron, while the pitch of the signal vias may be between about 2 and 12 micron, e.g., between about 4 and 9 micron. In some embodiments, the cross-sectional dimensions (e.g., diameters) of the power vias may be between about 7 and 11 micron, e.g., about 9 micron, while the cross-sectional dimensions of the signal vias may be between about 2 and 4 micron, e.g., about 3 micron. In some embodiments, the cross-sectional dimension may be between about 45%-55% of the pitch.

After vias are formed in a particular IC structure (e.g., the compute logic layer 120 or the first memory layer 130), the faces of the IC structures that are joined at the bonding interface may be grinded so that electrical connections can be made between vias of adjoining IC structures, e.g., at the interconnects 150. Grinding a face of an IC structure to reveal the vias may be performed using any suitable thinning/polishing processes as known in the art.

In addition to providing the interconnects 150 to transfer signal and/or power between the compute logic layer 120 and the first memory layer 130, the compute logic layer 120 is further physically bonded to the first memory layer 130. In particular, an upper face of the compute logic layer 120 (e.g., the face opposite the support structure 110) is bonded to a lower face of the first memory layer 130. Similarly, an upper face of the first memory layer 130 is bonded to a lower face of the second memory layer 140. The bonding may be performed using insulator-insulator bonding, e.g., as oxide-oxide bonding, where an insulating material of a first IC structure (e.g., the compute logic layer 120) is bonded to an insulating material of a second IC structure (e.g., the memory layer 130). In some embodiments, a bonding material may be present in between the faces of the first and second IC structures that are bonded together. The interconnects 150 or 160 extend through the bonding material and into the surrounding layers, e.g., the interconnects 150 extend into the compute logic layer 120 and the first memory layer 130, and the interconnects 160 extend into the first memory layer 130 and the second memory layer 140.

To bond two IC structures together, the bonding material may be applied to one or both faces of the first and second IC structures that should be bonded (e.g., to the lower face of the first memory layer 130 and/or the upper face of the compute logic layer 120). After the bonding material is applied, the first and second IC structures are put together, possibly while applying a suitable pressure and heating up the assembly to a suitable temperature (e.g., to relatively low temperatures, e.g., between about 50 and 200 degrees Celsius) for a duration of time. In some embodiments, the bonding material may be an adhesive material that ensures attachment of the first and second IC structures to one another. In some embodiments, the bonding material may be an etch-stop material. In some embodiments, the bonding material may be both an etch-stop material and have suitable adhesive properties to ensure attachment of the first and second IC structures to one another.

The bonding material may have a thickness between 50 nm and 1000 nm. In some embodiments, the bonding material has a thickness between 100 nm and 300 nm, e.g., the bonding material has a thickness of about 200 nm.

In some embodiments, the bonding material includes silicon in combination with one or more of oxygen, nitrogen, and carbon. The bonding material may be a polyimide, an epoxy polymer, or any underfill material. The bonding material may have a dielectric constant in the range of 1.5 to 8. In some embodiments, the bonding material has a dielectric constant that is less than 3.9, e.g., in the range of 1.5 to 3.9.

In some embodiments, the bonding material may include silicon, nitrogen, and carbon, where the atomic percentage of any of these materials may be at least 1%, e.g., between about 1% and 50%, indicating that these elements are added deliberately, as opposed to being accidental impurities which are typically in concentration below about 0.1%. Having both nitrogen and carbon in these concentrations in addition to silicon is not typically used in conventional semiconductor manufacturing processes where, typically, either nitrogen or carbon is used in combination with silicon, and, therefore, could be a characteristic feature of the hybrid bonding. Using an etch-stop material at the interface that includes include silicon, nitrogen, and carbon, where the atomic percentage of any of these materials may be at least 1%, e.g., SiOCN, may be advantageous in terms that such a material may act both as an etch-stop material, and have sufficient adhesive properties to bond the first and second IC structures together. In addition, an etch-stop material at the interface between the first and second IC structures that includes include silicon, nitrogen, and carbon, where the atomic percentage of any of these materials may be at least 1%, may be advantageous in terms of improving etch-selectivity of this material with respect to etch-stop materials that may be used in different of the first and second IC structures.

In some embodiments, no bonding material may be used, but there will still be a bonding interface resulting from the bonding of the layers to one another. Such a bonding interface may be recognizable as a seam or a thin layer in the microelectronic assembly, using, e.g., selective area diffraction (SED), even when the specific materials of the insulators of the first and second IC structures that are bonded together may be the same, in which case the bonding interface would still be noticeable as a seam or a thin layer in what otherwise appears as a bulk insulator (e.g., bulk oxide) layer.

In other embodiments of the IC device 100, compute logic devices may be provided in a layer above the memory layers 130, 140, in between memory layers 130, 140, or combined with the memory layers 130, 140.

The illustration of FIG. 1 is intended to provide a general orientation and arrangement of various layers with respect to one another, and, unless specified otherwise in the present disclosure, includes embodiments of the IC device 100 where portions of elements described with respect to one of the layers shown in FIG. 1 may extend into one or more, or be present in, other layers. For example, although two memory layers 130, 140 are shown in FIG. 1, in various embodiments, the IC device 100 may include any other number of one or more of such memory layers.

Example Memory Device with Cooling Structure

Figure 2:
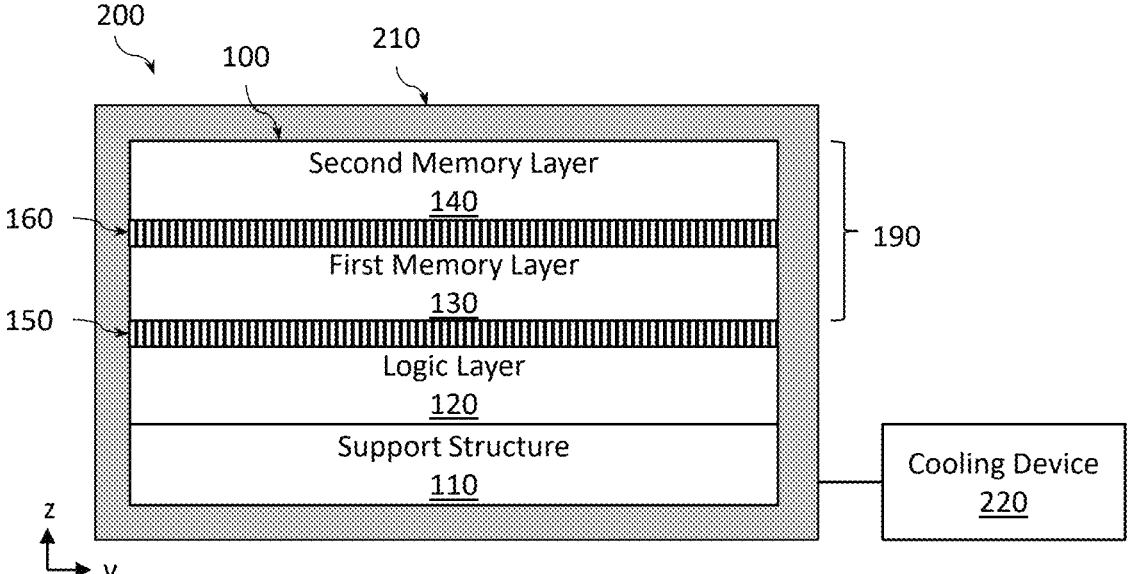
FIG. 2 provides a schematic illustration of device that includes an IC device with a logic layer and multiple layers of memory and a cooling structure around the IC device, according to some embodiments of the present disclosure.

FIG. 2 provides a schematic illustration of a device 200 that includes an IC device with a logic layer and multiple layers of memory and a cooling structure around the IC device, according to some embodiments of the present disclosure. The device 200 includes the IC device 100, described above with respect to FIG. 1, and the IC device 100 is surrounded by a cooling structure 210. The IC device 100 and the cooling structure 210 together form the device 200. The cooling structure 210 is coupled to a cooling device 220.

As noted above and described further below, the IC device 100 includes one or more memory layers, e.g., the first and second memory layers 130 and 140, as illustrated in FIG. 2. The memory layers 130 and/or 140 may include one or more SRAM arrays, e.g., the SRAM array described with respect to FIG. 7. In certain embodiments, the memory layers 130 and/or 140 may have any of structures of memory arrays and peripheral devices illustrated with respect to FIGS. 7-9, or the memory arrays and peripheral devices may be arranged in other ways. The cooling structure 210 cools the memory arrays included in the device 100 that the cooling structure 210 surrounds. In the example shown in FIG. 2, the cooling structure 210 cools the memory arrays included in the first memory layer 130 and second memory layer 140. It should be understood that a similar cooling structure 210 may cool IC devices, e.g., SRAM memory devices, having more or fewer layers than shown in FIG. 2, or having a different structure than shown in FIG. 2.

The cooling structure 210 is in thermal contact with the IC device 100, including one or more memory arrays included in the IC device 100. For example, the cooling structure 210 is in thermal contact with the memory layers 130 and 140, one or both of which may include one or more SRAM memory arrays. The cooling structure 210 may include one or more coolant materials which are cooled by the cooling device 220. The coolant material may be, for example, a liquid or gas refrigerant material, or a material that undergoes phase transition between liquid and gas. For example, germanium telluride is a phase transition material that may be used as a coolant material. The tellurium content may be adjusted to tune the coolant material for different temperatures. In other embodiments, a solid coolant material, such as a metal layer, may be used to form the cooling structure 210. Additional particular coolant materials that may be used include bismuth telluride, silicon, germanium, and copper.

As noted above, the cooling structure 210 is coupled to a cooling device 220. The cooling device 220 cools the coolant material of the cooling structure 210. In some embodiments, the cooling device 220 is included in a same package as the IC device 100, i.e., the cooling device 220 and device 200 are included in the same package. In other embodiments, the cooling device 220 is on a separate package from the device 200, and coupled to the cooling structure 210. The cooling device 220 may be an embodiment of the temperature regulation device 1828 or 1912 described with respect to FIGS. 13 and 14. For example, the cooling device 220 may include a compressor (e.g., a screw compressor), an HVAC (heating, air conditioning, and cooling) device, a thermoelectric device, a heat exchanger, a direct refrigerant (e.g., liquid helium or liquid nitrogen), a cryogenic device (e.g., a cold finger), a turbo refrigeration device, or another type of cooling device.

In the example shown in FIG. 2, the cooling structure 210 surrounds the IC device 100 on the four illustrated sides, i.e., the top of the IC device 100 (the side extending parallel to the support structure 110 in the y-direction over the second memory layer 140), the bottom of the IC device 100 (the side extending parallel to the support structure 110 in the y-direction under the support structure 110), and two of the sides of the IC device 100 extending in the z-direction and the x-direction, perpendicular to the support structure. The cooling structure 210 may further surround the IC device 100 on the sides of the IC device 100 extending in the z-direction and the y-direction, perpendicular to the support structure. In some embodiments, the cooling structure 210 may not completely surround the IC device 100. For example, the cooling structure 210 may surround some portion of the sides of the IC device 100 (e.g., the cooling structure 210 may not be formed under the support structure 110), or the cooling structure 210 may not completely cover one or more sides of the IC device 100 (e.g., if there is a gap on a side of the IC device 100 not covered by the cooling structure 210).

Example SRAM Memory Cell

Figure 3:
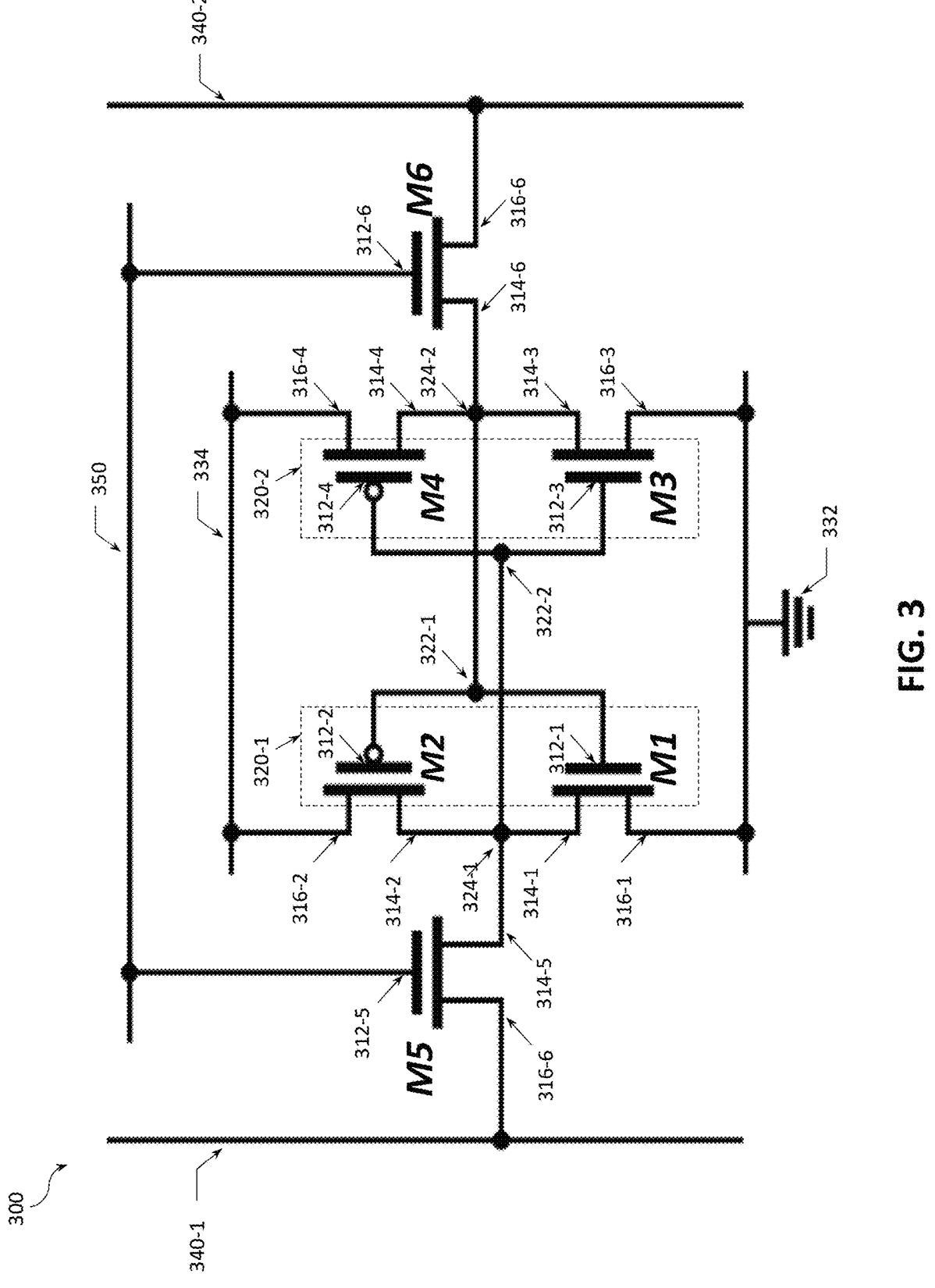
FIG. 3 is an electric circuit diagram of an example 6-transistor (6T) memory cell, according to some embodiments of the present disclosure.

FIG. 3 is an electric circuit diagram of an example 6-transistor (6T) memory cell 300 that may be an SRAM cell used in an SRAM array, according to some embodiments of the present disclosure. The SRAM cell 300 includes transistors M1-M4 for storing a bit value or a memory state (e.g., logic "1" or "0") of the cell, and two access transistors, M5 and M6, for controlling access to the cell (e.g., access to write information to the cell or access to read information from the cell 300). Each of the transistors M1-M6 may have any transistor architecture (e.g., planar or non-planar, FinFET, nanoribbon/nanowire, etc.).

In the SRAM cell 300, each bit may be stored on four transistors (M1, M2, M3, M4) that form two cross-coupled inverters 320, each having an input 322 and an output 324. The first inverter 320-1 may be formed by an NMOS transistor M1 and a PMOS transistor M2, while the second inverter 320-2 may be formed by an NMOS transistor M3 and a PMOS transistor M4. As shown in FIG. 3, the gate stack 312-1 of the transistor M1 may be coupled to the gate stack 312-2 of the transistor M2, and both of these gate stacks may be coupled to the input 322-1 of the first inverter 320-1. On the other hand, the first S/D region 314-1 of the transistor M1 may be coupled to the first S/D region 314-2 of the transistor M2, and both of these first S/D regions 314-1 and 314-2 may be coupled to the output 324-1 of the first inverter 320-1. Similarly, for the second inverter 320-2, the gate stack 312-3 of the transistor M3 may be coupled to the gate stack 312-4 of the transistor M4, and both of these gate stacks may be coupled to the input 322-2 of the second inverter 320-2, while the first S/D region 314-3 of the transistor M3 may be coupled to the first S/D region 314-4 of the transistor M4, and both of these first S/D regions 314-3 and 314-4 may be coupled to the output 324-2 of the second inverter 320-2. As also shown in FIG. 3, when the transistors M1 and M3 are NMOS transistors and when the transistors M2 and M4 are PMOS transistors as illustrated in FIG. 3, the second S/D regions 316-1 and 316-3 of the transistors M1 and M3 may be coupled to a ground voltage 332, while the second S/D regions 316-2 and 316-4 of the transistors M2 and M4 may be coupled to a supply voltage 334, e.g., VDD. In the embodiments of the SRAM cell 300 where the NMOS transistors shown in FIG. 3 are replaced with PMOS transistors and vice versa, the designation of the ground voltage 332 and the supply voltage 334 would be reversed as well, all of which embodiments being within the scope of the present disclosure.

The four transistors M1-M4 in such configuration form a stable storage cell for storing a bit value of 0 or 1. As further shown in FIG. 3, two additional access transistors, M5 an M6, may serve to control the access to the storage cell of the transistors M1-M4 during read and write operations. As shown in FIG. 3, the first S/D region 314-5 of the access transistor M5 may be coupled to the output 324-1 of the first inverter 320-1. Phrased differently, the first S/D region 314-5 of the access transistor M5 may be coupled to each of the first S/D region 314-1 of the transistor M1 and the first S/D region 314-2 of the transistor M2. The second S/D region 316-5 of the access transistor M5 may be coupled to a first BL 340-1. Thus, each of the first S/D region 314-1 of the transistor M1 and the first S/D region 314-2 of the transistor M2 may be coupled to the first BL 340-1 (e.g., via the access transistor M5). The gate 312-5 of the access transistor M5 may be coupled to a WL 350.

As further shown in FIG. 3, the first S/D region 314-6 of the access transistor M6 may be coupled to the output 324-2 of the second inverter 320-2. Phrased differently, the first S/D region 314-6 of the access transistor M6 may be coupled to each of the first S/D region 314-3 of the transistor M3 and the first S/D region 314-4 of the transistor M4. The second S/D region 316-6 of the access transistor M6 may be coupled to a second BL 340-2. Thus, each of the first S/D region 314-3 of the transistor M3 and the first S/D region 314-4 of the transistor M4 may be coupled to the second BL 340-2 (e.g., via the access transistor M6). The gate 312-6 of the access transistor M6 may be coupled to the WL 350. Thus, the gates 312-5 and 312-6 of both of the access transistors M5 and M6 may be coupled to a single, shared, WL, the WL 350.

As also shown in FIG. 3, the input 322-1 of the first inverter 320-1 may be coupled to the first S/D region 314-6 of the access transistor M6, while the input 322-2 of the second inverter 320-2 may be coupled to the first S/D region 314-5 of the access transistor M5. In other words, each of the gate stack 312-1 of the transistor M1 and the gate stack 312-2 of the transistor M2 may be coupled to the first S/D region 314-6 of the access transistor M6, while each of the gate stack 312-3 of the transistor M3 and the gate stack 312-4 of the transistor M4 may be coupled to the first S/D region 314-5 of the access transistor M5. Phrased differently, each of the gate stack 312-1 of the transistor M1 and the gate stack 312-2 of the transistor M2 may be coupled to the second BL 340-2 (e.g., via the access transistor M6), while each of the gate stack 312-3 of the transistor M3 and the gate stack 312-4 of the transistor M4 may be coupled to the first BL 340-1 (e.g., via the access transistor M5).

The WL 350 and the first and second BLs 340 may be used together to read and program (i.e., write to) the SRAM cell 300. In particular, access to the cell may be enabled by the WL 350 which controls the two access transistors M5 and M6 which, in turn, control whether the cell 300 should be connected to the BLs 340-1 and 340-2. During operation of the SRAM cell 300, a signal on the first BL 340-1 may be complementary to a signal on the second BL 340-2. The two BLs 340 may be used to transfer data for both read and write operations. In other embodiments of the SRAM cell 300, only a single BL 340 may be used, instead of two bitlines 340-1 and 340-2, although having one signal BL and one inverse, such as the two BLs 340, may help improve noise margins.

During read accesses, the BLs 340 are actively driven high and low by the inverters 320 in the SRAM cell 300. This may improve SRAM bandwidth compared to DRAM. The symmetric structure of the SRAMs cell 300 also allows for differential signaling, which may provide an improvement in detecting small voltage swings. Another difference with DRAM that may contribute to making SRAM faster than DRAM is that commercial chips accept all address bits at a time. By comparison, commodity DRAMs may have the address multiplexed in two halves, i.e. higher bits followed by lower bits, over the same package pins in order to keep their size and cost down.

Each of the WL 350 and the BLs 340, as well as intermediate elements coupling these lines to various terminals described herein, may be formed of any suitable electrically conductive material, which may include an alloy or a stack of multiple electrically conductive materials. In some embodiments, such electrically conductive materials may include one or more metals or metal alloys, with metals such as ruthenium, palladium, platinum, cobalt, nickel, hafnium, zirconium, titanium, tantalum, and aluminum. In some embodiments, such electrically conductive materials may include one or more electrically conductive alloys oxides or carbides of one or more metals.

Figure 4:
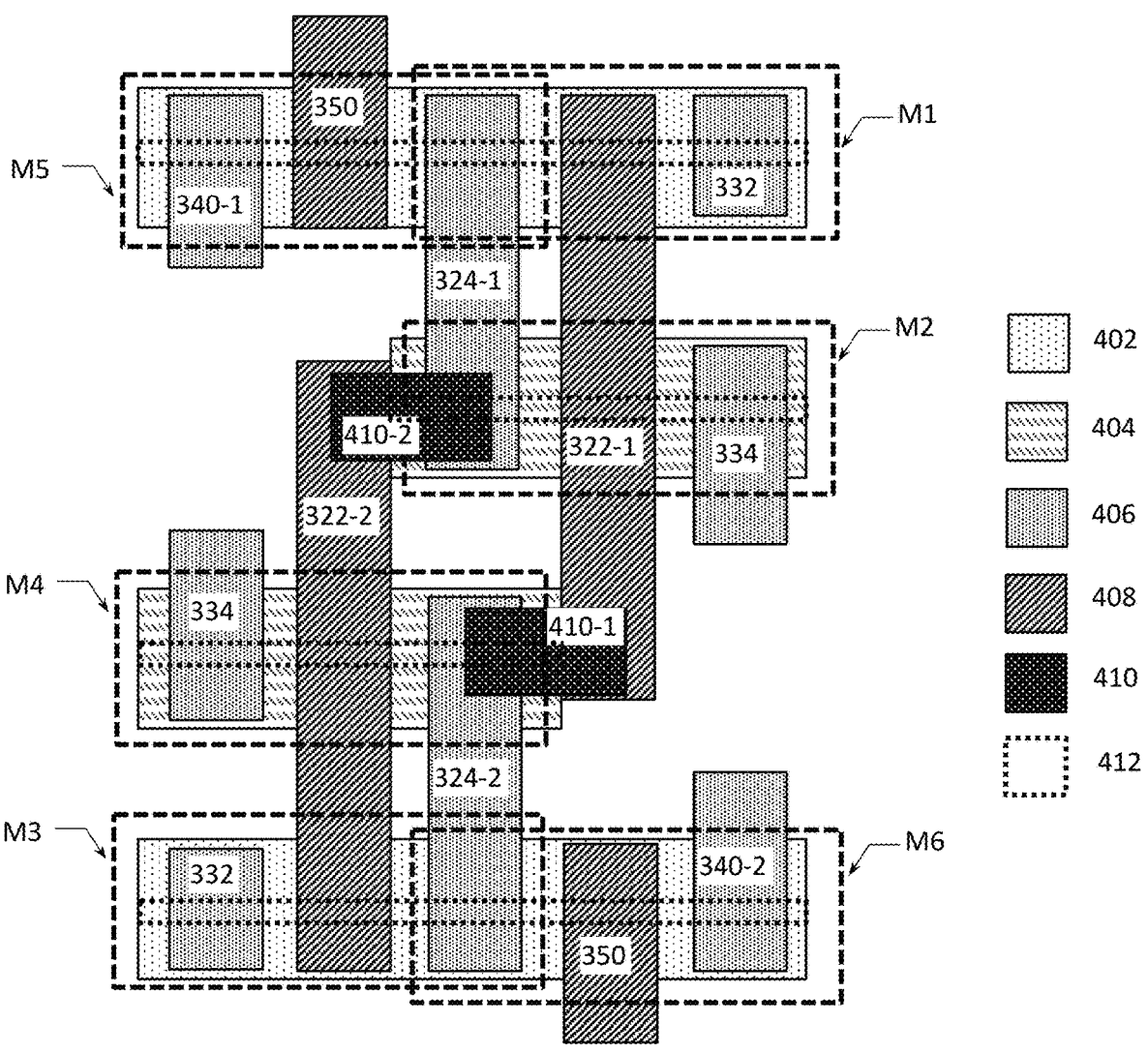
FIG. 4 provides a top-down plan view of one example implementation of a 6T memory cell, according to some embodiments of the present disclosure.

FIG. 4 provides a top-down plan view of one example implementation of a 6T memory cell, according to some embodiments of the present disclosure. FIG. 4 illustrates how the six transistors M1-M6 shown in FIG. 3 may be implemented. Several elements from FIG. 3 are labeled in FIG. 4. For example, the transistors M1-M6 are labeled in FIG. 4, with the approximate boundaries of the individual transistors shown in FIG. 4 with dashed rectangles. Certain elements, e.g., the specific S/D regions 314 and 312 and the gate stacks 316, are not labeled in FIG. 4 in order to not clutter the drawings.

FIG. 4 illustrates that transistors M1 and M5 may be provided along a first region of an N-type semiconductor 402, transistors M2 and M4 may each be provided along a respective first and second region of a P-type semiconductor 404, and the transistors M3 and M6 may be provided along a second region of the N-type semiconductor 402. Each of the regions of the N-type semiconductor 402 and P-type semiconductor 404 may be formed in a support structure (e.g., a substrate) or over a support structure, e.g., as a fin or nanoribbon. The N-type semiconductor 402 is suitable for forming transistors of a first type, e.g., NMOS transistors, while the P-type semiconductor 404 is suitable for forming transistors of a second type, e.g., PMOS transistors, thus realizing NMOS transistors M1, M3, M5, and M6, and PMOS transistors M2 and M4, as shown in FIG. 3.

As noted with respect to FIG. 3, the transistors M1-M6 may have any transistor architecture, including FinFET or nanoribbon/nanowire architectures. FIG. 4 illustrates an outline of a channel structure 412 within each of the semiconductor regions 402 and 404. The channel structure 412 represents a semiconductor channel structure, such as a semiconductor fin or semiconductor nanowire, which, in certain embodiments, may be used to form the transistors M1-M6.

In the plan view shown in FIG. 4, S/D contacts 406, gate electrodes 408, and interconnects 410 are formed over the N-type and P-type semiconductors 402 and 404, e.g., as layers processed over the N-type and P-type semiconductors 402 and 404. While not specifically shown in FIG. 4, S/D regions may be formed under the S/D contacts 406, and gate dielectrics may be formed under the gate electrodes 408. Any of the materials and processes described with respect to FIG. 4 may be used to form the transistors shown in FIG. 4.

More specifically, a shared gate stack may be used to realize the gate stack 312-1 of the transistor M1 coupled to the gate stack 312-2 of the transistor M2. The shared gate stack is labelled 322-1 in FIG. 4, representing a node that is the input 322-1 of the first inverter 320-1 of the SRAM cell 300. Similarly, a shared gate stack may be used to realize the gate stack 212-3 of the transistor M3 coupled to the gate stack 212-4 of the transistor M4 3. The shared gate stack is labelled 322-2 in FIG. 4, representing a node that is the input 322-2 of the second inverter 320-2 of the SRAM cell 300.

As also shown in FIG. 4, a first shared S/D contact may be used to realize the first S/D region 314-1 of the transistor M1 coupled to the first S/D region 314-2 of the transistor M2. The first shared S/D contact is labelled 324-1 in FIG. 4, representing a node that is the output 324-1 of the first inverter 320-1 of the SRAM cell 300. Similarly, a second shared S/D contact may be used to realize the first S/D region 314-3 of the transistor M3 coupled to the first S/D region 314-4 of the transistor M4. The first shared S/D contact is labelled 324-2 in FIG. 4, representing a node that is the output 324-2 of the second inverter 320-2 of the SRAM cell 300.

A first interconnect 410-1, shown in FIG. 4, may then be used to couple the shared gate stack 322-1 of the first inverter 320-1 to the shared S/D contact 324-2 of the second inverter 320-2, thus realizing the coupling of the input 322-1 of the first inverter 320-1 to the output 324-2 of the second inverter 320-2, shown in FIG. 3. Similarly, a second interconnect 410-2, shown in FIG. 4, may then be used to couple the shared gate stack 322-2 of the second inverter 320-2 to the shared interconnect 324-1 of the first inverter 320-1, thus realizing the coupling of the input 322-2 of the second inverter 320-2 to the output 324-1 of the first inverter 320-1, shown in FIG. 3.

FIG. 4 further illustrates that, in a given SRAM cell 300, the first S/D region 314-5 of the transistor M5 may be shared with (e.g., be the same as) the first S/D region 314-1 of the transistor M1 (since both of these transistors are implemented in a single region of the N-type semiconductor 402). In addition, the first S/D region 314-3 of the transistor M3 may be shared with (e.g., be the same as) the first S/D region 314-6 of the transistor M6 (since both of these transistors are implemented in a single region of the N-type semiconductor 402).

Both of the second S/D region 316-1 of the transistor M1 and the second S/D region 316-3 of the transistor M3 may be coupled to the ground potential 332, as was described with reference to FIG. 3. Both of the second S/D region 316-2 of the transistor M2 and the second S/D region 316-4 of the transistor M4 may be coupled to the supply voltage 334, as was described with reference to FIG. 3.

Example IC Device with Stacked Peripheral Layers and SRAM Layers

Figure 5:
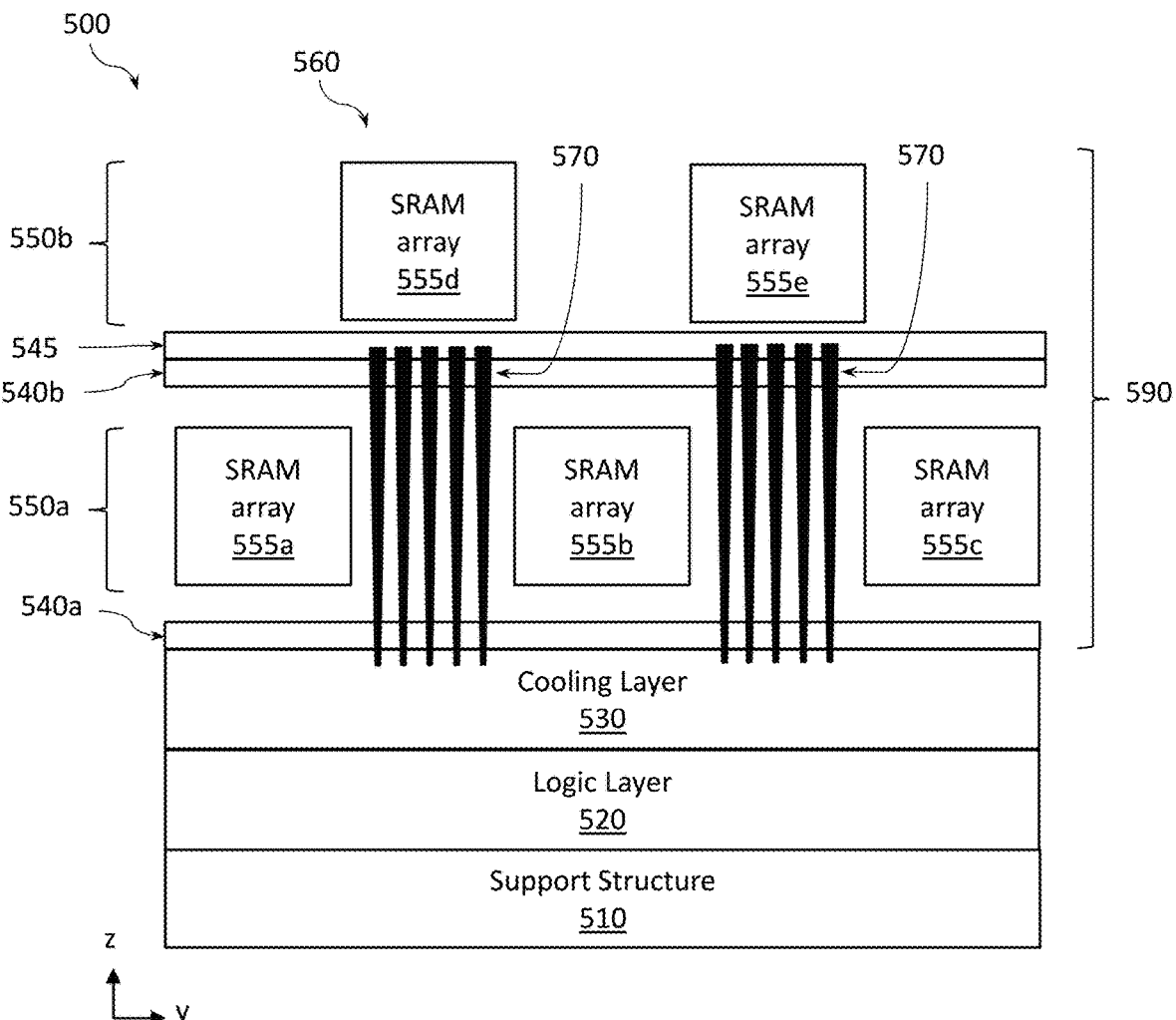
FIG. 5 provides an example cross-section of an IC device with SRAM layers stacked over a cooling layer with vias coupling an upper SRAM layer to the cooling layer, according to some embodiments of the present disclosure.

FIG. 5 provides an example cross-section of an IC device with SRAM layers stacked over a cooling layer with vias coupling an upper SRAM layer to the cooling layer, according to some embodiments of the present disclosure. FIG. 5 includes a support structure 510, a logic layer 520, and a cooling layer 530. The support structure 510 may be similar to the support structure 110 described in relation to FIGS. 1 and 2. The logic layer 520 may be similar to the logic layer 120 described in relation to FIGS. 1 and 2. In some embodiments, the logic layer 520 may be omitted, e.g., if the IC device 500 is a dedicated SRAM memory device rather than a device that includes both memory and computation circuitry.

FIG. 5 further includes a cooling layer 530, which may include one or more cooling devices. As one example, the cooling layer 530 may include one or more thermoelectric refrigerators or thermoelectric coolers, which are on-chip devices used for temperature stabilization. Thermoelectric coolers use the Peltier effect to create a heat flux at the junction of two different materials, e.g., at the junction of n-type and p-type materials. Alternatively, one or more microrefrigerators, e.g., thin film microrefrigerators, may be included in the cooling layer 530. A cooling device in the cooling layer 530 may be coupled to a heat sink within the cooling layer 530 or outside the cooling layer.

In some embodiments, the cooling layer 530 may include a coolant or refrigerant, e.g., as described with respect to FIG. 2. In some embodiments, a coolant or refrigerant in the cooling layer 530 is coupled to a cooling device located outside the cooling layer 530, e.g., to a compressor or another type of cooling device (e.g., any of the cooling devices 220 described above) that cools the coolant material in the cooling layer 530. The cooling device coupled to the cooling layer 530 may be located outside the cooling layer 530. The cooling device may be located either within the device 500 (e.g., on the same package as the device 500, or in a different layer of the device 500) or outside the device 500, e.g., as described with respect to FIG. 2. In some embodiments, a cooling device outside the cooling layer 530 is coupled to the cooling layer 530 by one or more cold fingers.

FIG. 5 illustrates various layers that make up a thermal controlled memory structure 590: a first thermal insulator layer 540a, a first SRAM layer 550a, a second thermal insulator layer 540b, a thermal interface layer 545, and a second SRAM layer 550b. Additional thermal insulator layers 540, thermal interface layers 545, and/or SRAM layers 550 may be included in the IC device 500, e.g., above the SRAM layer 750b.

Each of the SRAM layers 550 includes several SRAM arrays 555. In particular, the first SRAM layer 550a includes the SRAM arrays 555a, 555b, and 555c, and the second SRAM layer 550b includes the SRAM arrays 555d and 555e. Each SRAM layer 550 may include more or fewer SRAM arrays 555 than shown in FIG. 5. Each SRAM array 555 includes a set of SRAM memory cells, such as the SRAM bitcells depicted in FIGS. 3 and 4. Each SRAM array 555 may further include some control circuitry, e.g., a row decoder, column input/output, and timing circuitry. An example layout for a memory array is shown in FIG. 5.

Each of the thermal insulator layers 540 provides thermal insulation between other layers, reducing heat transfer between objects on opposite sides of the thermal insulator layer 540. A thermal insulator layer 540 may be made of, for example, silicon dioxide ($SiO_2$) or other dielectric materials, carbon, or carbon-doped dielectric materials. In some embodiments, a thermal insulator layer 540 is or includes an air gap. In addition to the illustrated thermal insulator layers 540 extending parallel to the support structure 510, the sides of the device 500 extending in the z-direction (perpendicular to the support structure 510) may include a thermal insulator layer to prevent the cool temperature from escaping the sides of the SRAM layers 550.

The thermal interface layer 545 enables thermal transfer to SRAM arrays 555, e.g., the SRAM arrays 555d and 555e in the example arrangement shown in FIG. 5. The thermal interface layer 545 may include a material that is cooled by the cooling vias 570 extending between the thermal interface layer 545 and the cooling layer 530, as described further below. For example, the thermal interface layer 545 may include a coolant or refrigerant that is cooled by the cooling vias 570 and flows across the thermal interface layer 545, e.g., the coolants described with respect to FIG. 2. As another example, the thermal interface layer 545 may be a cold plate, e.g., a solid material (e.g., a metal) that is cooled by the cooling vias 570.

The cooling vias 570 extend in the z-direction and form connections between the cooling layer 530 and the thermal interface layer 545. The cooling vias 570 couple the thermal interface layer 545 to the cooling layer 530, to transfer a cool temperature from the cooling layer 530 to the thermal interface layer 545. The cooling vias 570 may be formed from a material that transfers heat, e.g., copper or another metal. In this example, the cooling vias 570 may be formed after the formation of the second thermal insulator layer 540b, and the cooling vias 570 are long vias that extend through multiple layers. In other embodiments, the cooling vias 570 may be formed as a series of stacked vias that are sequentially formed and connected at metal layers, e.g., at metal interconnects within metal layers (e.g., a metal layer of the SRAM layer 550a), forming a via-interconnect-via structure.

The SRAM layers 550 can be arranged relative to one or more thermal insulator layer(s) 540 and one or more thermal interface layer(s) 545 to selectively cool one or more particular SRAM layers 550. In the example shown in FIG. 5, the first SRAM layer 550a is thermally insulated from the cooling components, e.g., the cooling layer 530 and the thermal interface layer 545. This prevents the first SRAM layer 550a from being cooled by the cooling components. A thermal interface layer 545 is layered over the first SRAM layer 550a and the second thermal insulator layer 540b. The thermal interface layer 545 is in thermal contact with the second SRAM layer 550b. The thermal interface layer 545 is further coupled to the cooling layer 530 by cooling vias 570, which extend from the cooling layer 530 to the thermal interface layer 545 through the first thermal insulator layer 540a, first SRAM layer 550a, and second thermal insulator layer 540b. The thermal interface layer 545 is cooled by the cooling vias 570, and in turn the thermal interface layer 545 cools the second SRAM layer 550b, e.g., the SRAM arrays 555d and 555e. Thus, in this example, the second SRAM layer 550b is cooled, but the first SRAM layer 550a is not cooled. A portion of the SRAM arrays may be cooled if the cooling devices (e.g., cooling devices in the cooling layer 530) cannot adequately cool all of the SRAM arrays 555 included in the device 500, or if power limitations enable cooling a portion of the device 500.

In some embodiments, different SRAM arrays may be dedicated to different memory types or purposes based on their operating temperatures, e.g., the memory layer 550b may be dedicated to high-speed memory access, while the memory layer 550a may be used for storing data for which a lower access speed is sufficient. In some embodiments, the sizes of the memory arrays 555 may vary based on whether the memory arrays are cooled, e.g., the SRAM arrays 555d and 555e, which are cooled by the thermal interface layer 545, may be larger (e.g., up to 5000×5000 bits), while the SRAM arrays 555a, 555b, and 555c, which are not cooled, may be smaller (e.g., up to 1000×1000 bits).

In the example shown in FIG. 5, the SRAM arrays 555d and 555e are positioned over the vias 570, which are between the SRAM arrays 555a, 555b, and 555c in the first SRAM layer 550a. Thus, the SRAM arrays in the second SRAM layer 550b are staggered relative to the SRAM arrays in the first SRAM layer 550a, i.e., the SRAM arrays 555d and 555e are offset in the y-direction (which is parallel to the plane of the support structure 510) relative to the SRAM arrays 555a, 555b, and 555c.

Although not specifically shown in FIG. 5, the device 500 may include peripheral devices associated with the SRAM arrays 555, e.g., devices for accessing the SRAM arrays 555. Various peripheral devices supporting the SRAM arrays are described in relation to FIGS. 8A, 8B, and 9. In typical SRAM arrangements, peripheral devices are included in the same layer as the SRAM arrays 555, e.g., in the SRAM layer 550. In other embodiments described herein, different groups of peripheral circuits may be disaggregated from the SRAM array layers and included in one or more separate peripheral device layers, as described with respect to FIG. 9. For example, one or more types of peripheral devices may be included in the logic layer 520 or, alternatively, in another layer not specifically illustrated in FIG. 5. For example, peripheral devices may be included in a peripheral device layer stacked over the logic layer 520 and below the cooling layer 530. Alternatively, a peripheral device layer may be stacked above the cooling layer, e.g., between the thermal insulator layer 540 and the first SRAM layer 550a. In some embodiments, a peripheral device layer may be thermally cooled, e.g., by placing a peripheral device layer in thermal contact with a thermal interface layer (e.g., above the thermal interface layer 545 and below the second SRAM layer 550b). As another example, the first SRAM layer 550a, which is thermally insulated from the cooling components as discussed above, may include blocks of peripheral devices instead of or in addition to the SRAM arrays 555a-555c illustrated in FIG. 5.

In addition to the cooling vias 570 illustrated in FIG. 5, the device 500 may include various conductive elements for transferring signals and power within the device 500. For example, the device 500 may include various metal layers to interconnect various inputs and outputs of the logic layer 520 to inputs and outputs of the SRAM layers 550 and/or to inputs and outputs of peripheral devices for accessing the SRAM arrays 555. One or more metal layers may be included, e.g., above the logic layer 520 and below the cooling layer 530, between the cooling layer 530 and the SRAM layer 550a, between the SRAM layers 550a and 550b (e.g., between the SRAM layer 550a and the thermal insulator layer 540b, or between the thermal insulator layer 540b and the thermal interface layer 545), and/or above the second SRAM layer 550b. These metal layers may be considered part of the layers above or below them. The metal layers may include trench structures extending into and/or out of the page, i.e., in the x-direction in the reference coordinate system of FIG. 5, and/or trench structures extending in the y-direction in the reference coordinate system.

Figure 6:
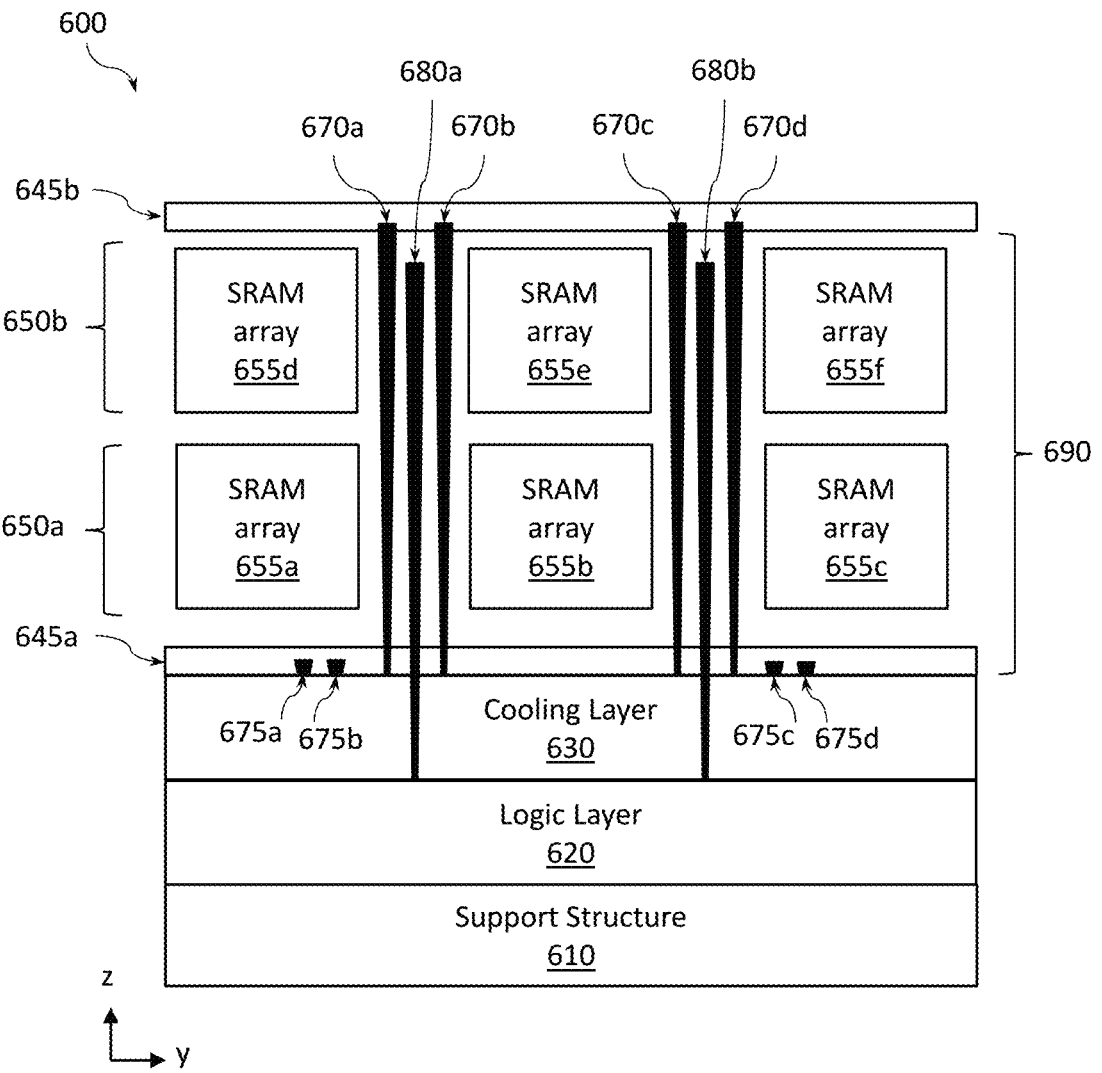
FIG. 6 provides an example cross-section of an IC device with SRAM layers stacked over a cooling layer for cooling multiple SRAM layers, according to some embodiments of the present disclosure.

The device 500 may also include additional vias, e.g., power vias for transferring power between layers of the device 500, and signal vias for transferring data signals between layers of the device 500. Signal and/or power vias extend in the z-direction. Signal and/or power vias connect to the metal layers described above, to transfer data and/or power between metal layers of the device 500. For example, a signal via may be coupled, at one end, to the logic layer 520 (or a metal layer adjacent to the logic layer 520) and, at the other end, to the SRAM layer 550a (or a metal layer or peripheral device layer coupled to the SRAM layer 550a). The signal via extends through the cooling layer 530 and thermal insulator layer 540a. A signal via may also extend from the logic layer 520 to the second SRAM layer 550b, or between the first SRAM layer 550a and the second SRAM layer 550b. As described with respect to the cooling vias 570, a signal via may be a long via that extends through multiple layers, or a signal via may be formed as a series of stacked vias that are sequentially formed and connected at metal layers, forming a via-interconnect-via structure. FIG. 6 depicts and example signal or power via extending between a logic layer and an SRAM layer.

FIG. 6 provides an example cross-section of an IC device with SRAM layers stacked over a cooling layer for cooling multiple SRAM layers, according to some embodiments of the present disclosure. FIG. 6 includes a support structure 610, a logic layer 620, and a cooling layer 630, which are similar to the corresponding layers shown in FIG. 5. FIG. 6 further includes four layers that make up a memory structure 690: a first thermal interface layer 645a, a first SRAM layer 650a, a second SRAM layer 650b, and a second thermal interface layer 645b. The SRAM layers 650 each include several SRAM arrays 655. One or more additional SRAM layers may be included in the IC device 600, e.g., above the SRAM layer 650b. One or more additional thermal interface layers 645 may be included in the IC device 600, e.g., between the SRAM layers 650a and 650b. Furthermore, one or more peripheral device layers may be included in the IC device 600, e.g., instead of the first SRAM layer 650a, below the first SRAM layer 650a, or between the first SRAM layer 650a and second SRAM layer 650b.

The thermal interface layers 645 and SRAM layers 650 are similar to the thermal interface layer 545 and SRAM layers 550 described above. In this example, the first thermal interface layer 645a is coupled to the cooling layer 630 via a set of cooling vias 675. The cooling vias 675 extend in the z-direction and form connections between the cooling layer 630 and the first thermal interface layer 645a to transfer a cool temperature from the cooling layer 630 to the first thermal interface layer 645a. The second thermal interface layer 645b is coupled to the cooling layer 630 via a second set of cooling vias 670. The cooling vias 670 also extend in the z-direction and form connections between the cooling layer 630 and the second thermal interface layer 645b to transfer a cool temperature from the cooling layer 630 to the second thermal interface layer 645b. The cooling vias 670 and 675 are similar to the cooling vias 570 described with respect to FIG. 5. In some embodiments, the cooling vias 675 are not included, and the cooling vias 670 transfer a cool temperature to both the first thermal interface layer 645a and the second thermal interface layer 645b.

In this example, the first thermal interface layer 645a cools the first SRAM layer 650a, and the second thermal interface layer 645b cools the second SRAM layer 650b. In this example, all of the SRAM arrays 655 are cooled by the cooling layer 630 and thermal interface layers 645, rather than a portion of the SRAM arrays being cooled, as illustrated in FIG. 5. As noted above, in some embodiments, an additional thermal interface layer may be between the SRAM layers 650a and 650b. Cooling the SRAM arrays 655 may provide faster and smoother reliable memory access across the memory device, as discussed above. Furthermore, this may allow each of the SRAM arrays 655 included in the device 600 to be larger than prior SRAM array designs, e.g., up to 5000×5000 bits.

The device 600 may include one or more thermal insulator layers similar to the thermal insulator layers 540 in FIG. 5, e.g., below the first thermal interface layer 645a or above the second thermal interface layer 645b. In addition, the sides of the device 600 extending in the z-direction (perpendicular to the support structure 610) may include a thermal insulator layer to prevent the cool temperature from escaping the sides of the SRAM layers 650. Furthermore, the device 600 may include various metal layers not shown in FIG. 6, as described with respect to FIG. 5.

FIG. 6 also illustrates two signal vias 680a and 680b. The signal vias 680 are coupled between the logic layer 620 and the second SRAM layer 650b to transfer data signals between the logic layer 620 and the second SRAM layer 650b. Similar signal vias may be formed between the logic layer 620 and the first SRAM layer 650a and/or between first and second SRAM layers 650a and 650b. In this example, the signal vias 680 are arranged between the cooling vias 670, e.g., the signal via 680a is between cooling vias 670a and 670b. The signal vias 680 and cooling vias 670 may be made of the same material (e.g., copper) or different materials. The signal vias 680 and cooling vias 670 may have a same or similar diameter, or the signal vias 680 and cooling vias 670 may have different sizes or diameters, e.g., the cooling vias 670 may have larger top diameters than the signal vias 680. Power vias (not specifically shown in FIG. 6) may also be formed in the device 600, as described with respect to FIG. 5.

In this example, the SRAM arrays 655 in the second SRAM layer 650b are formed directly over SRAM arrays 655 in the first SRAM layer 650a, e.g., the SRAM array 655d is formed directly over the SRAM array 655a. The vias 670 and 680 extend between SRAM arrays 655 in both the first SRAM layer 650a and second SRAM layer 650b, e.g., the vias 670a and 680a are positioned between the SRAM arrays 655a and 655b, and between the SRAM arrays 655d and 655e.

Example Arrangement of a Memory Array

Figure 7:
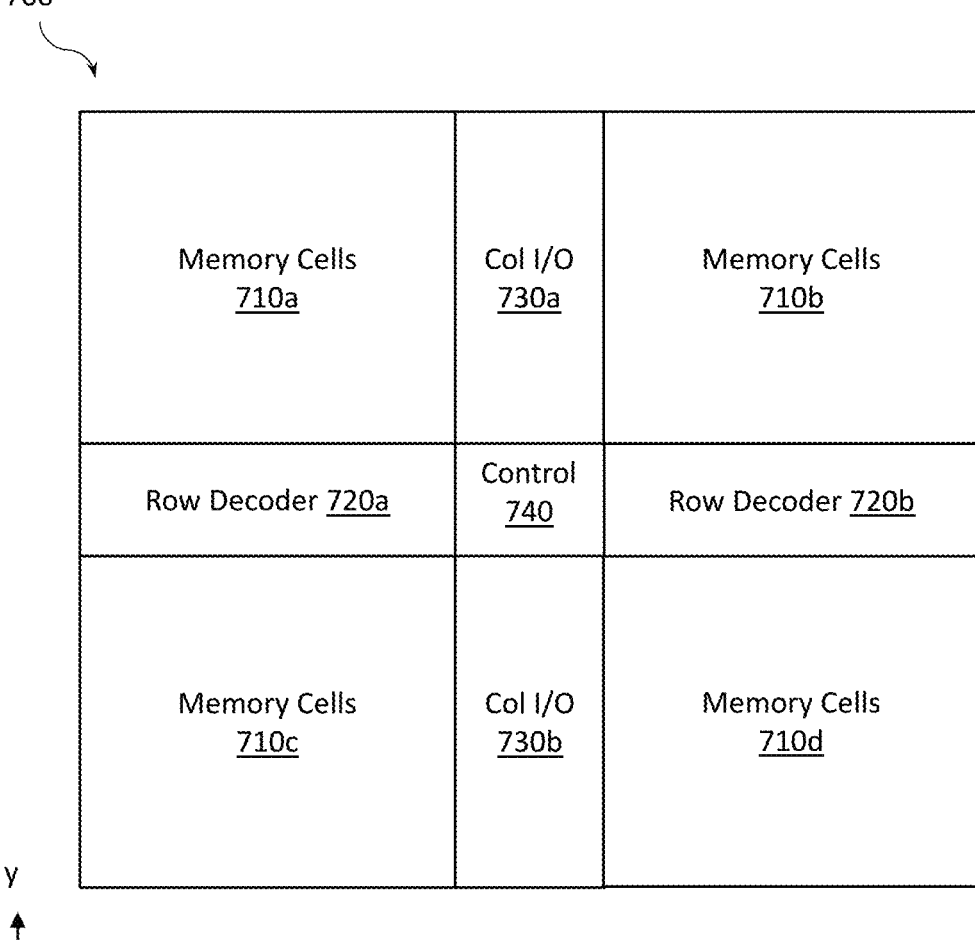
FIG. 7 provides a plan view of a memory array, according to some embodiments of the present disclosure.

FIG. 7 provides a plan view of a memory array 700, according to some embodiments of the present disclosure. The memory array 700 may be, for example, the SRAM array 555 of FIG. 5 or the SRAM array 655 of FIG. 6. Alternatively, the memory array 700 may be an SRAM array included in the first memory layer 130 or second memory layer 140 of the device 100 illustrated in FIGS. 1 and 2. The memory array includes four blocks of memory cells 710a, 710b, 710c, and 710d; two row decoders 720a and 720b; two column input and output (col I/O) blocks 730a and 730b; and a control block 740.

The memory cells 710 may be SRAM memory cells, such as the memory cells shown in FIGS. 3 and 4. The memory cells 710 are arranged in rows and columns, where a row of memory cells are coupled to a common WL, and a column of memory cells are connected to a common BL. In some embodiments, each column of memory cells is connected to two BLs: a first BL and a second BL that is the inverse of the first BL.

The row decoders 720 receive a memory address for a read or write operation, e.g., from mid-logic (described below with respect to FIG. 8). The row decoders 720 decode the memory address and determine whether the memory address corresponds to a memory cell (or set of memory cells) accessible via the row decoder 720. Each row decoder 720 is associated with and coupled to a subset of the memory cells 710. In FIG. 7, the row decoder 720a is coupled to the two blocks of memory cells, 710a and 710c, that are adjacent to the row decoder 720a. Likewise, the row decoder 720b is coupled to the two blocks of memory cells, 710b and 710d, that are adjacent to the row decoder 720b. If the memory array 700 receives a read or write request for a particular set of memory cells, the row decoder 720a determines whether the address in the request corresponds to memory cells in either block 710a or 710c, and the row decoder 720b determines whether the address in the request corresponds to memory cells in either block 710b or 710d. If a row decoder 720 determines that an address corresponds to memory cells in its associated blocks, the row decoder 720 selects the WL for the addressed memory cells. The row decoder 720 may further include a row driver for each WL to drive a signal down the WL; the row driver may include one or more inverters to drive the WL.

The col I/O blocks 730 read out data from selected columns (BLs, or pairs of BLs if inverse BLs are included) of the memory cells 710. In FIG. 7, the col I/O block 730a is coupled to and reads data from the two blocks of memory cells, 710a and 710b, that are adjacent to the col I/O block 730a. Likewise, the col I/O block 730b is coupled to and reads data from the two blocks of memory cells, 710c and 710d, that are adjacent to the col I/O block 730b. As noted above, the memory cells 710 are arranged in rows and columns. In a read operation, for example, a WL is driven by a row decoder 720, e.g., the row decoder 720a drives a selected WL in the block of memory cells 710a. The selected WL is coupled to many memory cells, and the read request may request data from a subset of these memory cells, as indicated by an address range in the read request. The col I/O (e.g., the col I/O 730a) may include a column multiplexer that selects a subset of the columns to read, and read/write circuitry that reads (in a read operation) data from the selected subset of columns. In a write operation, the col I/O block 730 writes data to a set of memory cells indicated by the address and selected by the column multiplexers.

The control block 740 includes schedules and timers to synchronize operations across the memory array 700. The control block 740 may also include buffers and/or other control circuitry known in SRAM and/or DRAM technologies.

Example Arrangement of a Memory Layer

Figure 8A:
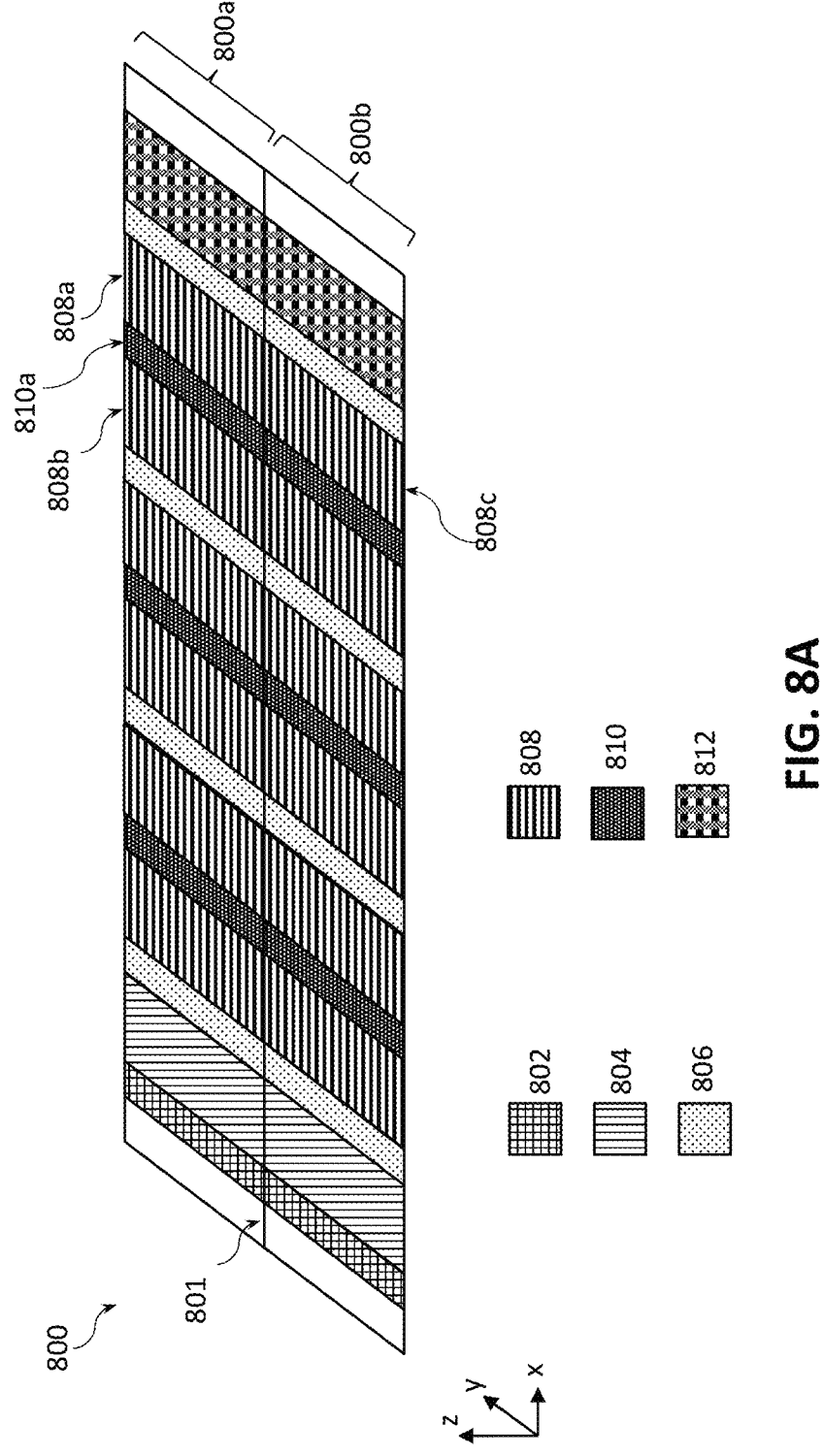
FIG. 8A provides a plan view of a memory device including memory arrays and peripheral circuitry, according to some embodiments of the present disclosure.

FIG. 8A provides a plan view of a single-layer memory device 800 that includes memory arrays and peripheral circuitry, according to some embodiments of the present disclosure. Different regions of the memory device 800 are indicated by different patterns, with a legend showing the correspondence between the reference numerals and patterns being provided at the bottom of the drawing page. The same set of patterns is used in FIGS. 8A, 8B, and 9 to refer to different blocks or regions. The legend illustrates that the different patterns show a self-test block 802, a voltage block 804, repeaters 806, memory arrays 808, mid-logic 810, and input and output (I/O) circuitry 812. Although a certain number of a given element may be illustrated in FIGS. 8A, 8B, and 9 (e.g., twelve memory arrays and eight repeaters in FIG. 8A), this is simply for ease of illustration, and more, or less, than that number may be included in a memory structure according to various embodiments of the present disclosure. Furthermore, FIG. 8A shows one possible arrangement of the different regions. In other embodiments, the regions may be arranged differently than shown in FIG. 8A.

A center line 801 is depicted running through the memory device 800 traveling in the x-direction. The center line 801 divides the memory device 800 into two portions 800*a* and 800*b*, each portion encompassing a different portion of the memory device 800 in the y-direction. The circuitry regions or blocks on either side of the line 801 may be considered separate regions. For example, the center line 801 separates the memory array 808*a* in the first portion 800*a* from the memory array 808*c* in the second portion 800*b*. These memory arrays 808*a* and 808*c* may operate independently. Various regions which may be broken into separate portions are discussed jointly below (e.g., a single self-test block 802 is discussed). However, it should be understood that the memory device 800 may include any number of each circuitry region or block. In some embodiments, the memory device 800 is not separated into two portions 800*a* and 800*b*; in other embodiments, the memory device 800 is separated into three or more portions in the y-direction.

The self-test block 802 includes circuitry used during manufacture of the memory device 800 to test functionality of the memory device 800 prior to the memory device 800 being shipped or incorporated into a larger system. The self-test block 802 is typically present on a memory device but not used during normal operation. In the example shown in FIG. 8, one self-test block 802 is shown, but in other embodiments, there may no self-test block 802 or multiple self-test blocks 802.

The voltage block 804 includes circuitry for maintaining voltage levels within the memory device 800. The voltage block 804 may include one or more capacitors to store charge. During operation, the memory device 800 receives power from an external power source. However, in certain cases, operations of the memory device 800 may draw more current than can be provided by the external power source. For example, a large amount of data being accessed at once or in quick succession may consume more current than the external power source can provide, or the external power source may have a delay in delivering a greater current. If the current draw exceeds the power supply or if the power supply is delayed, the voltage block 804 can provide a temporary current surge, e.g., by drawing down charge from a capacitor in the voltage block 804. The voltage block 804 also includes switching circuitry for controlling charging and discharging of the capacitor(s). For example, the switching circuitry recharges the capacitor, e.g., when the power draw for memory operations are reduced. In the example shown in FIG. 8, one voltage block 804 is shown, but in other embodiments, there may no voltage blocks 804, or multiple voltage blocks 804 (e.g., at different locations across the memory device 800) may be included.

The repeaters 806 include circuitry for maintaining a signal as it traverses the memory device 800. The repeaters 806 may include buffers, e.g., a series of inverting buffers, that receive a signal and pass the signal onto another part of the memory device 800. The repeaters 806 break up wires crossing the length (in the x-direction) of the memory device 800, which improves signal transmission across the memory device 800 and may reduce delay across the memory device 800.

The memory arrays 808 include blocks of memory cells and control circuitry for the particular blocks of memory cells. The memory arrays 808 may be arranged as shown in FIG. 7, with four blocks of memory cells 710, two row decoders 720, two col I/O blocks 730, and a control block 740. In other embodiments, other arrangements may be used. The memory arrays 808 may be, for example, SRAM arrays as described with respect to FIGS. 3-7.

The mid-logic 810 receives a memory address for a read or write operation, e.g., from the I/O circuitry 812. The mid-logic 810 includes circuitry for decoding the memory address and determining whether the memory address corresponds to a memory array associated with and coupled to the mid-logic 810. For example, the mid-logic 810*a* labelled in FIG. 8A determines whether a memory address is present in either array 808*a* or 808*b*, which are adjacent to the mid-logic 810*a*. If the mid-logic 810 determines that a memory address is present in an associated memory array, the mid-logic 810 passes the memory address to the row decoders 720, described with respect to FIG. 7. In a memory device 800 with many memory arrays 808, the number of memory addresses may be more than the row decoders 720 can keep track of. The mid-logic 810 ensures that only relevant addresses are sent to the row decoders 720, which may result in greater efficiency and less surface area devoted to the row decoders 720. The mid-logic 810 may also include a timing circuit that schedules memory requests and acts as an intermediary between off-device communications (e.g., the I/O circuitry 812) and on-device data transfer.

The I/O circuitry 812 interacts with external devices, e.g., the logic layer 120 shown in FIGS. 1 and 2, or other devices coupled to the memory device 800. The I/O circuitry 812 receives read and/or write requests an external device and transmits the requests to other circuitry (e.g., the mid-logic 810) in the memory device 800. The I/O circuitry 812 further transmits signals (e.g., data retrieved responsive to a read request) to the external device. In some embodiments, the I/O circuitry 812 includes additional circuitry, such as timing circuitry and encryption and/or decryption circuitry (e.g., to encrypt data prior to passing it to an external device).

FIG. 8A illustrates a device layer of the memory device 800. The memory device 800 may further include one or more additional layers, including metal layers, not shown in FIG. 8A. The metal layers provide communication between different regions of the memory device 800. In particular, at least some of the regions shown in FIG. 8A are connected by vias to a metal layer that includes trenches that span across one or more of the regions shown in FIG. 8A. This enables communication between different regions of FIG. 8A. The metal layer(s) may further enable power delivery to different regions of FIG. 8A, e.g., from a power supply in the I/O circuitry 812 and/or from the voltage block 804, described above.

Figure 8B:
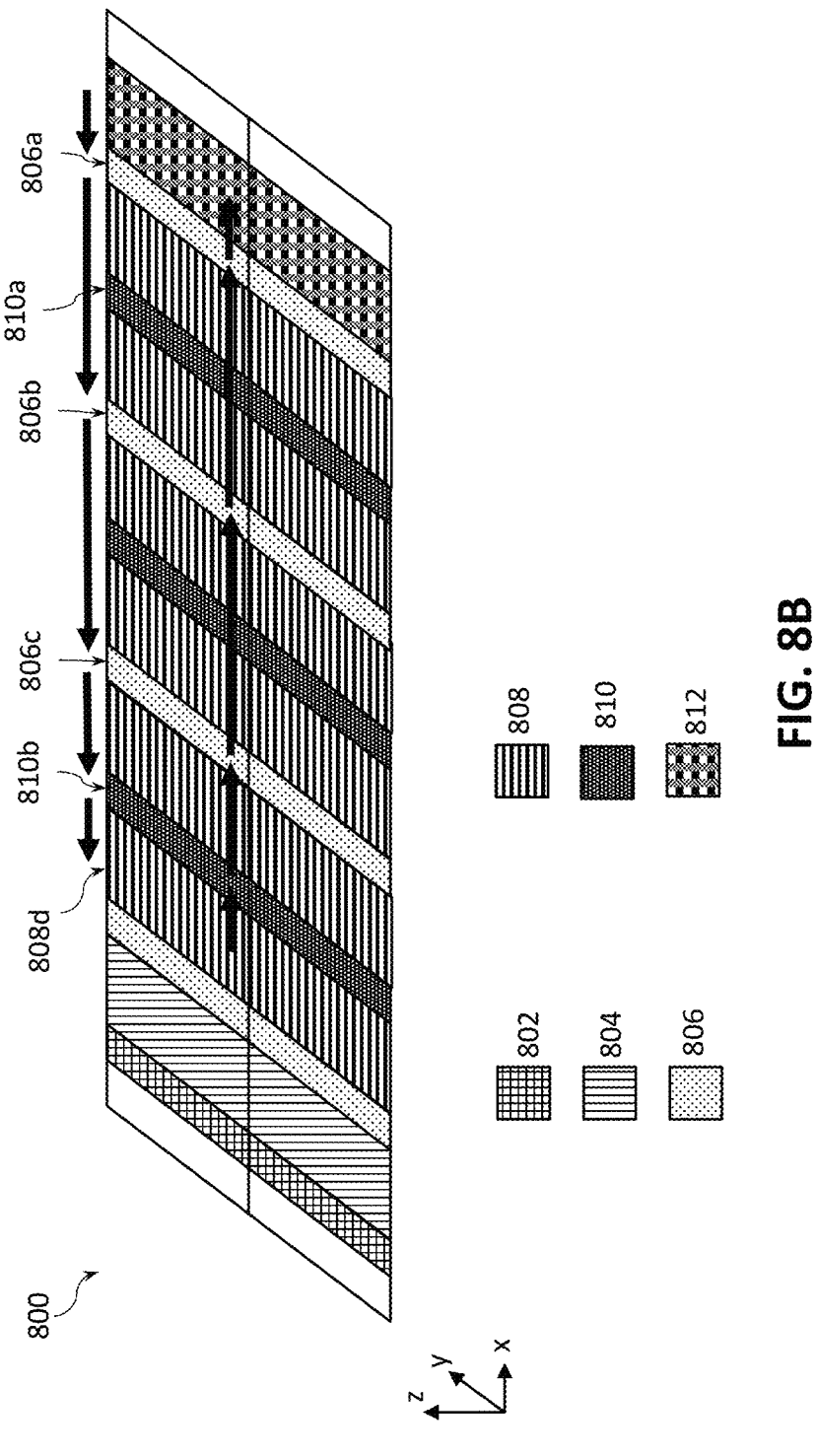
FIG. 8B illustrates a data pathway across the memory device of FIG. 11A, according to some embodiments of the present disclosure.

FIG. 8B illustrates a data pathway across the memory device of FIG. 8A, according to some embodiments of the present disclosure. In this example, the I/O circuitry 812 receives a request (e.g., a read request) from an external device. The I/O circuitry 812 transmits the read request, including a specific memory address or address range (generally referred to as an address range), across the memory device 800 and to the various mid-logic 810 regions, e.g., region 810*a* and 810*b*. In this example, the repeaters 806 are used to transmit the read request across the memory device 800, as illustrated by the arrows moving from the I/O circuitry 812 and across the top of FIG. 8B. More specifically, the read request moves from the I/O circuitry 812 to the repeater 806*a*, to the repeater 806*b*, and the repeater 806*c*. Mid-logic regions 810 receive the read request from one of the repeaters 806. For example, the mid-logic 810*a* may receive the read request from the repeater 806*a*. The mid-logic 810*a* may discard the read request if the address range does not match its associated memory arrays (here, memory arrays 808*a* and 808*b* labelled in FIG. 8A).

In this example, the address range in the read request corresponds to the memory array 808*d*. The mid-logic 810*b* receives the read request from the repeater 806*c* and determines that the address range in the read request is within the memory array 808*d*. The mid-logic 810*b* transmits the read request to the memory array 808*d*, and the memory array 808*d* outputs the data stored at the requested memory range. The output data travels back to the I/O circuitry 812 in a similar manner (e.g., through the mid-logic 810*b*, repeaters 806*c*, 806*b*, and 806*a*, and to the I/O circuitry 812), as illustrated by the right-pointing arrows in FIG. 8B.

Example Arrangement of a Stacked Memory

Figure 9:
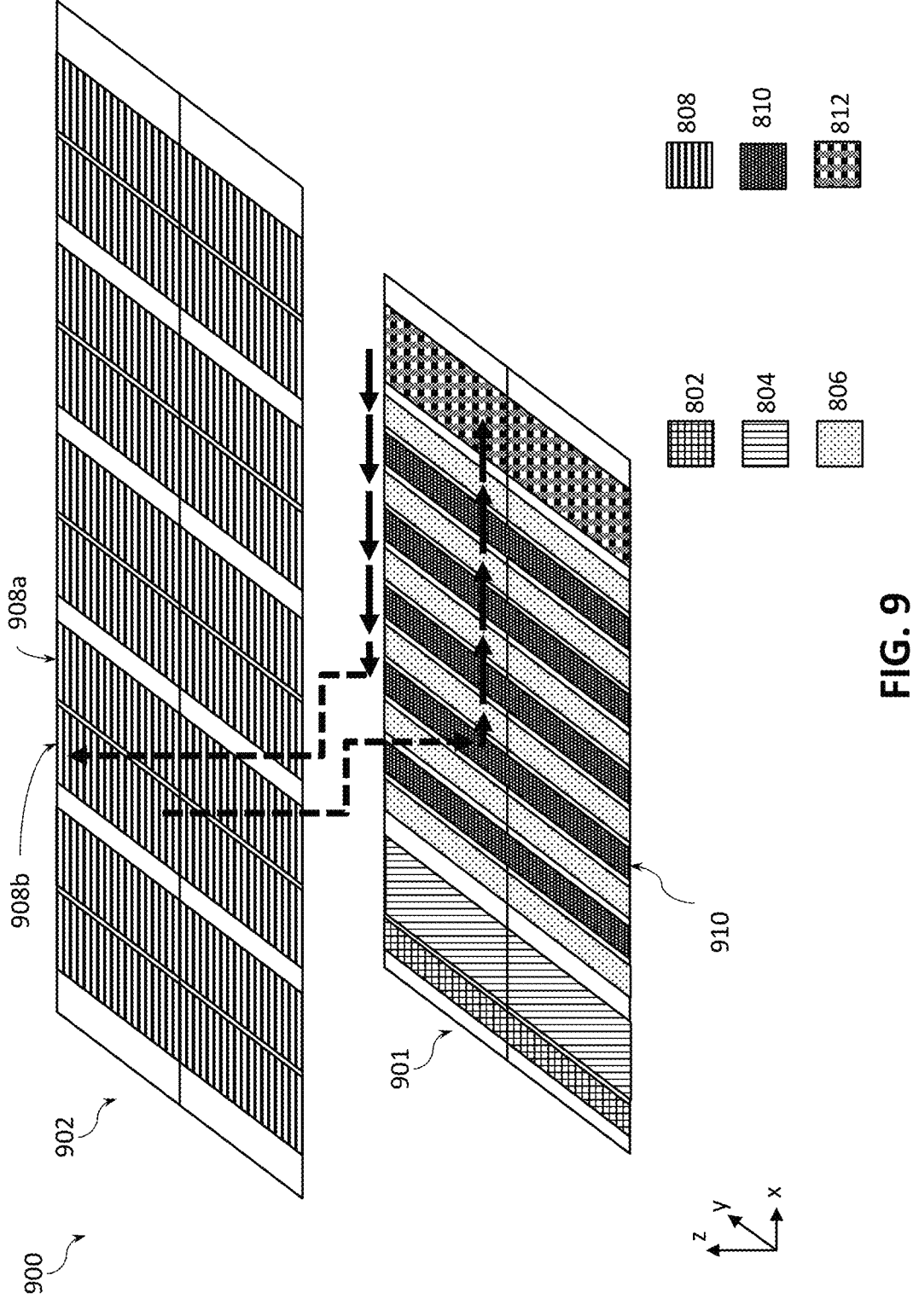
FIG. 9 provides a plan view of an example stacked memory device that includes a peripheral layer and a memory layer having multiple memory arrays, according to some embodiments of the present disclosure.

In some embodiments, the IC devices described herein may be arranged as stacked memory devices that include some peripheral circuitry in a first layer and memory arrays in a second layer. FIG. 9 illustrates an example of a stacked memory device 900 that includes the same device regions 802-812 shown in FIG. 8. The characteristics of the device regions 802-812 shown in FIG. 9 are similar to the corresponding regions shown in FIG. 8A, and descriptions of the device regions 802-812 are not repeated here.

The stacked memory device 900 includes two layers: a peripheral device layer that includes peripheral devices, and a memory layer that includes one or more memory arrays. In alternate embodiments, the memory layer may, in some cases, also include some peripheral circuitry. While only one peripheral device layer and one memory layer are illustrated in FIG. 9, it should be understood that multiple memory layers and/or multiple peripheral layers may be included in a memory structure. Furthermore, while the memory layer is shown being stacked over the peripheral layer in FIG. 9, in other embodiments, a peripheral layer may be stacked over a memory layer, or a peripheral layer may be between two or more memory layers.

As with FIG. 8A, FIG. 9 illustrates device layers of a memory device. The memory device shown in FIG. 9 may further include one or more additional layers, including metal layers, not depicted in FIG. 9. The metal layers provide communication between different regions of the memory device, including between different layers, as described with respect to FIGS. 8A and 8B, as well as FIGS. 1, 2, 5, and 6. While the stacked memories shown in FIG. 9 is referred to as a "memory device," it should be understood that assemblies may not be standalone devices. In some embodiments, the memory assembly shown in FIG. 9 may be an embedded memory incorporated into a larger device, e.g., the memory structure 190 shown in FIGS. 1 and 2.

Moving peripheral devices to the peripheral device layer can improve processing of the SRAM arrays (e.g., the SRAM arrays 555 or 655) and/or the peripheral devices. For example, if peripheral devices that are fabricated using a different processing technology from the SRAM arrays are moved to the peripheral device layer, this simplifies the processing of the SRAM layer, and may result in fewer defects in the SRAM arrays. Furthermore, moving the peripheral devices to a peripheral device layer frees up space in the SRAM layer to provide additional and/or larger SRAM arrays and thus increase memory capacity. As noted above, cooling the memory device and/or specific SRAM layers (e.g., the SRAM layer 550*b* shown in FIG. 5) may help enable larger memory arrays to be included. In addition, having a separate layer for peripheral devices increases the surface area available for the peripheral devices themselves, so circuit designers may devote more area to peripheral devices. This can also lead to improved memory access, e.g., by increasing bandwidth of signals to and from the SRAM arrays.

Turning to the details of FIG. 9, FIG. 9 provides a plan view of an example stacked memory device 900 that includes a first layer 901 having peripheral devices and a second layer 902 having multiple memory arrays, according to some embodiments of the present disclosure. Moving peripheral devices to the peripheral device layer can free up surface area on the memory layer that can be used to add additional memory arrays. The first layer 901, which may be referred to as a peripheral device layer, includes the self-test block 802, the voltage block 804, the repeaters 806, the mid-logic 810, and the I/O circuitry 812. The second layer 902, which may be referred to as a memory layer or memory array layer, includes the memory arrays 808. In this example, the second layer 902 includes more memory arrays than the example shown in FIGS. 8A and 8B, e.g., 20 memory arrays, rather than the twelve that were illustrated in FIGS. 8A and 8B.

In some embodiments, the surface areas of the stacked layers can be different from each other. For example, the surface area of a peripheral device layer may be smaller than the surface area of the memory layer, as illustrated in FIG. 9. To achieve this, the peripheral device layer may be formed on a die having a first surface area, and the memory layer formed on a die having a second surface area, where the second surface area is larger than the first surface area. FIG. 9 is an example with a smaller peripheral device layer 901 and a larger memory layer 902. While two layers of different sizes are shown in FIG. 8, it should be understood that additional layers of varying die sizes may be included. For example, a smaller peripheral device layer may support two or more larger memory layers.

In FIG. 9, the mid-logic 810 are not aligned with their associated memory arrays 808. Communication between the mid-logic 810 and memory arrays 808 may traverse a metal layer between the first and second layers 901 and 902. FIG. 9 illustrates a data pathway through the memory device 900. The data pathway proceeds from the I/O circuitry 812 to the mid-logic regions 810 via the repeaters 1106 as described above. If a mid-logic region, e.g., mid-logic 910, determines that the address range in the I/O request is within one of the memory arrays corresponding to the mid-logic 910, e.g., one of the memory arrays 908*a* and 908*b* (in this case, 908*b*), the mid-logic 910 transmits the request between the layers 901 and 902 to the memory array 908*b*. In particular, the request traverses a signal via, and at least one trench in a metal layer that transmits signals in the x-direction. While the movement in the x-direction is illustrated as between the layers 901 and 902, in some embodiments, the request may traverse the memory device 900 along a different metal layer, e.g., a metal layer above the second layer 902 or below the first layer 901. The memory array 908*b* may return data stored at the requested memory range, and the data travels back to the I/O circuitry 812 in a similar manner (e.g., down to the mid-logic 910 in first layer 901, through several repeaters 806, and to the I/O circuitry 812), as illustrated in FIG. 9.

Example Electronic Devices

Arrangements with one or more stacked memory devices as disclosed herein may be included in any suitable electronic device. FIGS. 10-14 illustrate various examples of devices and components that may include one or more three-dimensional memory arrays as disclosed herein.

Figure 10A:
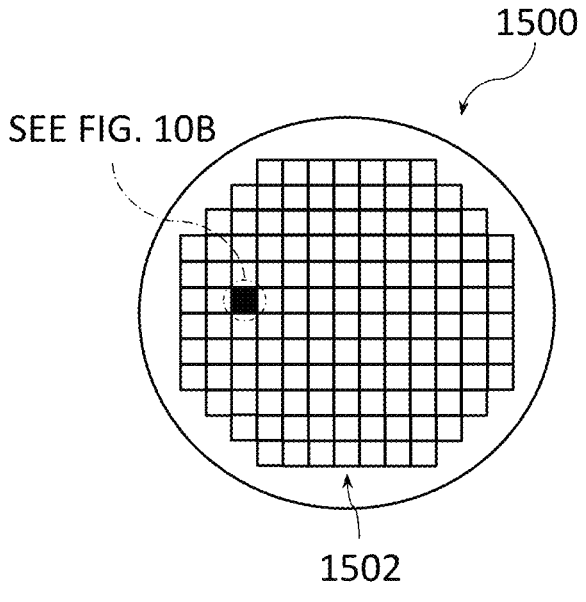
Figure 10B:
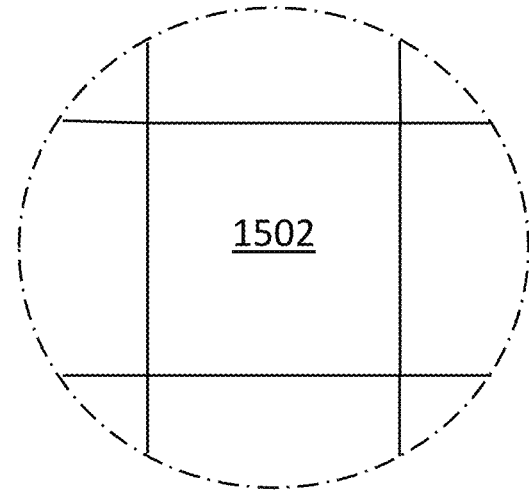

FIGS. 10A and 1013 are top views of a wafer and dies that include one or more IC structures with devices including one or more stacked memory devices with a cooling system in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC structure (e.g., the IC structures as shown in any of FIGS. 1-4, or any further embodiments of the IC structures described herein). After the fabrication of the semiconductor product is complete (e.g., after manufacture of one or more IC structures with one or more stacked memory devices with a cooling system as described herein, included in a particular electronic component, e.g., in a memory device), the wafer 1500 may undergo a singulation process in which each of the dies 1502 is separated from one another to provide discrete "chips" of the semiconductor product. In particular, devices that include one or more stacked memory devices with a cooling system as disclosed herein may take the form of the wafer 1500 (e.g., not singulated) or the form of the die 1502 (e.g., singulated). The die 1502 may include one or more transistors (e.g., one or more of the transistors 1640 of FIG. 11, discussed below) and/or supporting circuitry to route electrical signals to the transistors, as well as any other IC components. In some embodiments, the wafer 1500 or the die 1502 may include a memory device (e.g., an SRAM device), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 10) or other logic that is configured to store information in the memory devices or execute instructions stored in the memory array.

Figure 11:
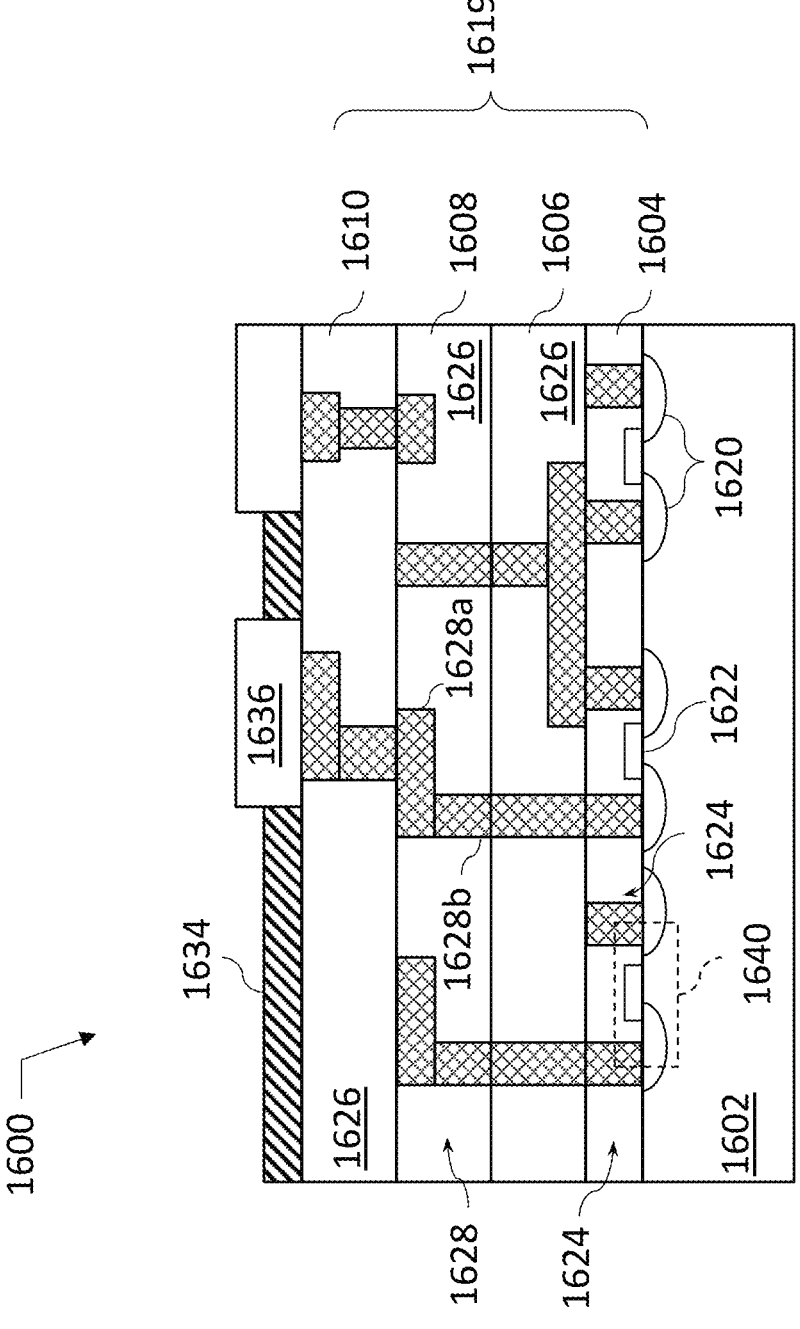
FIG. 11 is a cross-sectional side view of an IC package that may include one or more stacked memory devices with a cooling system in accordance with any of the embodiments disclosed herein.

FIG. 11 is a cross-sectional side view of an IC device 1600 that may include one or more stacked memory devices with a cooling system in accordance with any of the embodiments disclosed herein. The IC device 1600 may be formed on a substrate 1602 (e.g., the wafer 1500 of FIG. 10A) and may be included in a die (e.g., the die 1502 of FIG. 10B). The substrate 1602 may be any substrate as described herein. The substrate 1602 may be part of a singulated die (e.g., the dies 1502 of FIG. 10B) or a wafer (e.g., the wafer 1500 of FIG. 10A).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 11 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate electrode layer and a gate dielectric layer.

The gate electrode layer may be formed on the gate interconnect support layer and may consist of at least one P-type workfunction metal or N-type workfunction metal, depending on whether the transistor is to be a PMOS or an NMOS transistor, respectively. In some implementations, the gate electrode layer may consist of a stack of two or more metal layers, where one or more metal layers are workfunction metal layers and at least one metal layer is a fill metal layer. Further metal layers may be included for other purposes, such as a barrier layer or/and an adhesion layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 electron Volts (eV) and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, aluminum carbide, tungsten, tungsten carbide. An N-type metal layer will enable the formation of an NMOS gate electrode with a workfunction that is between about 3.9 eV and about 4.2 eV.

In some embodiments, when viewed as a cross section of the transistor 1640 along the source-channel-drain direction, the gate electrode may be formed as a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may be implemented as a combination of U-shaped structures and planar, non-U-shaped structures. For example, the gate electrode may be implemented as one or more U-shaped metal layers formed atop one or more planar, non-U-shaped layers. In some embodiments, the gate electrode may consist of a V-shaped structure (e.g., when a fin of a FinFET transistor does not have a "flat" upper surface, but instead has a rounded peak).

Generally, the gate dielectric layer of a transistor 1640 may include one layer or a stack of layers, and the one or more layers may include silicon oxide, silicon dioxide, and/or a high-k dielectric material. The high-k dielectric material included in the gate dielectric layer of the transistor 1640 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The IC device 1600 may include one or more stacked memory devices with a cooling system at any suitable location in the IC device 1600.

The S/D regions 1620 may be formed within the substrate 1602 adjacent to the gate 1622 of each transistor 1640, using any suitable processes known in the art. For example, the S/D regions 1620 may be formed using either an implantation/diffusion process or a deposition process. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion implantation process. In the latter process, an epitaxial deposition process may provide material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620. In some embodiments, an etch process may be performed before the epitaxial deposition to create recesses in the substrate 1602 in which the material for the S/D regions 1620 is deposited.

Electrical signals, such as power and/or input/output (I/O) signals, may be routed to and/or from the transistors 1640 of the device layer 1604 through one or more interconnect layers disposed on the device layer 1604 (illustrated in FIG. 11 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form an ILD stack 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 11). Although a particular number of interconnect layers 1606-1610 is depicted in FIG. 11, embodiments of the present disclosure include IC devices having more or fewer interconnect layers than depicted.

In some embodiments, the interconnect structures 1628 may include trench contact structures 1628a (sometimes referred to as "lines") and/or via structures 1628b (sometimes referred to as "holes") filled with an electrically conductive material such as a metal. The trench contact structures 1628a may be arranged to route electrical signals in a direction of a plane that is substantially parallel with a surface of the substrate 1602 upon which the device layer 1604 is formed. For example, the trench contact structures 1628a may route electrical signals in a direction in and out of the page from the perspective of FIG. 11. The via structures 1628b may be arranged to route electrical signals in a direction of a plane that is substantially perpendicular to the surface of the substrate 1602 upon which the device layer 1604 is formed. In some embodiments, the via structures 1628b may electrically couple trench contact structures 1628a of different interconnect layers 1606-1610 together.

The interconnect layers 1606-1610 may include a dielectric material 1626 disposed between the interconnect structures 1628, as shown in FIG. 11. The dielectric material 1626 may take the form of any of the embodiments of the dielectric material provided between the interconnects of the IC structures disclosed herein.

In some embodiments, the dielectric material 1626 disposed between the interconnect structures 1628 in different ones of the interconnect layers 1606-1610 may have different compositions. In other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include trench contact structures 1628a and/or via structures 1628b, as shown. The trench contact structures 1628a of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include via structures 1628b to couple the trench contact structures 1628a of the second interconnect layer 1608 with the trench contact structures 1628a of the first interconnect layer 1606. Although the trench contact structures 1628a and the via structures 1628b are structurally delineated with a line within each interconnect layer (e.g., within the second interconnect layer 1608) for the sake of clarity, the trench contact structures 1628a and the via structures 1628b may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606.

The IC device 1600 may include a solder resist material 1634 (e.g., polyimide or similar material) and one or more bond pads 1636 formed on the interconnect layers 1606-1610. The bond pads 1636 may be electrically coupled with the interconnect structures 1628 and configured to route the electrical signals of the transistor(s) 1640 to other external devices. For example, solder bonds may be formed on the one or more bond pads 1636 to mechanically and/or electrically couple a chip including the IC device 1600 with another component (e.g., a circuit board). The IC device 1600 may have other alternative configurations to route the electrical signals from the interconnect layers 1606-1610 than depicted in other embodiments. For example, the bond pads 1636 may be replaced by or may further include other analogous features (e.g., posts) that route the electrical signals to external components.

Figure 12:
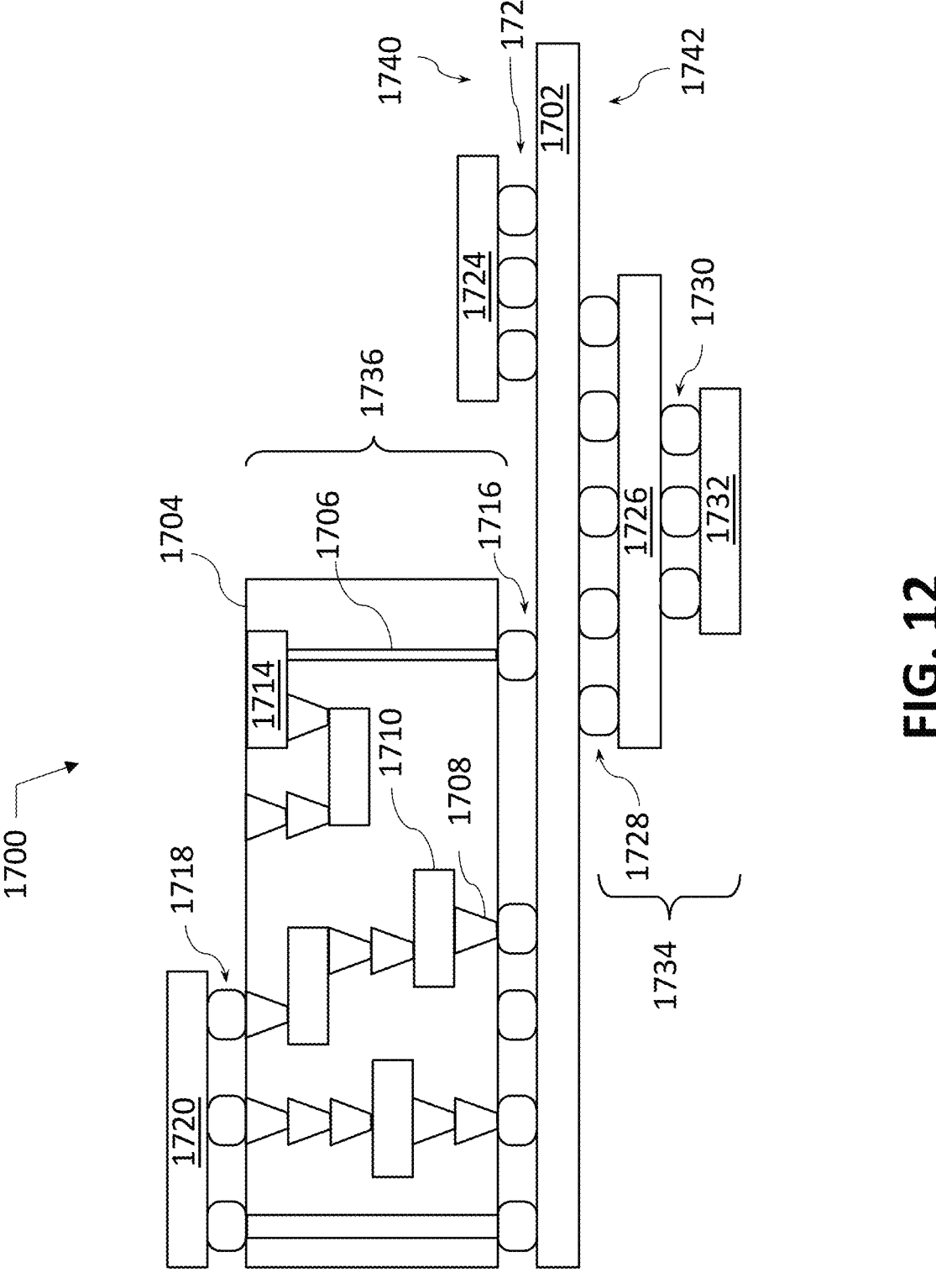
FIG. 12 is a cross-sectional side view of an IC device assembly that may include one or more stacked memory devices with a cooling system in accordance with any of the embodiments disclosed herein.

FIG. 12 is a cross-sectional side view of an IC device assembly 1700 that may include components having or being associated with (e.g., being electrically connected by means of) one or more stacked memory devices with a cooling system in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. In particular, any suitable ones of the components of the IC device assembly 1700 may include any of the stacked memory devices with a cooling system disclosed herein.

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 12 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702 and may include solder balls (as shown in FIG. 12), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 12, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 10B), an IC device (e.g., the IC device 1600 of FIG. 11), or any other suitable component. In some embodiments, the IC package 1720 may include one or more stacked memory devices with a cooling system, as described herein. Generally, the interposer 1704 may spread a connection to a wider pitch or reroute a connection to a different connection. For example, the interposer 1704 may couple the IC package 1720 (e.g., a die) to a ball grid array (BGA) of the coupling components 1716 for coupling to the circuit board 1702. In the embodiment illustrated in FIG. 12, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

The interposer 1704 may be formed of an epoxy resin, a fiberglass-reinforced epoxy resin, a ceramic material, or a polymer material such as polyimide. In some implementations, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 12 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 13:
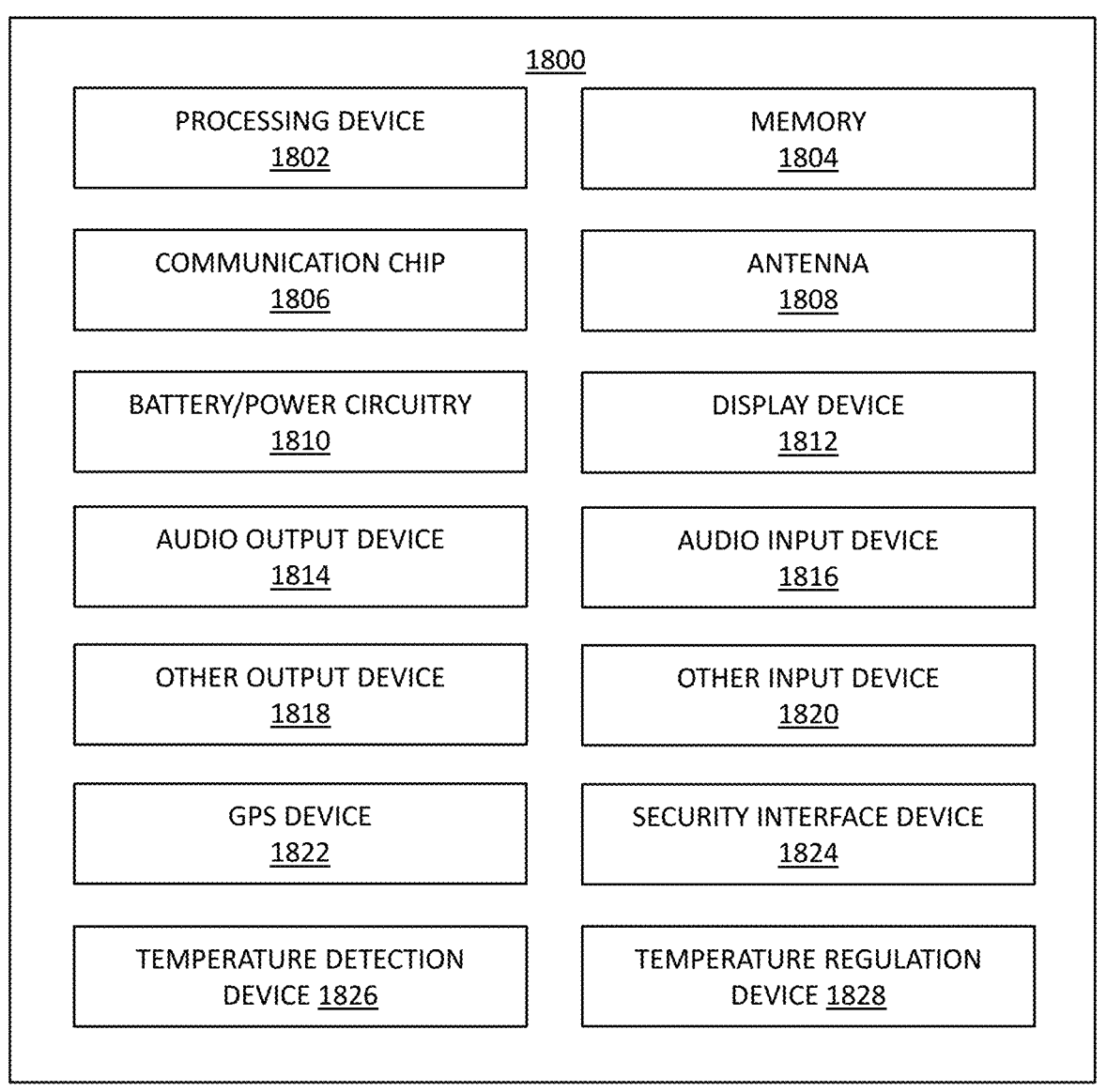
FIG. 13 is a block diagram of an example computing device that may include one or more stacked memory devices with a cooling system in accordance with any of the embodiments disclosed herein.

FIG. 13 is a block diagram of an example computing device 1800 that may include one or more components including one or more stacked memory devices with a cooling system in accordance with any of the embodiments disclosed herein. For example, any suitable ones of the components of the computing device 1800 may include a die (e.g., the die 1502 (FIG. 10B)) having one or more stacked memory devices with a cooling system. Any one or more of the components of the computing device 1800 may include, or be included in, an IC device 1600 (FIG. 11). Any one or more of the components of the computing device 1800 may include, or be included in, an IC device assembly 1700 (FIG. 12).

A number of components are illustrated in FIG. 13 as included in the computing device 1800, but any one or more of these components may be omitted or duplicated, as suitable for the application. In some embodiments, some or all of the components included in the computing device 1800 may be attached to one or more motherboards. In some embodiments, some or all of these components are fabricated onto a single system-on-a-chip (SoC) die.

Additionally, in various embodiments, the computing device 1800 may not include one or more of the components illustrated in FIG. 13, but the computing device 1800 may include interface circuitry for coupling to the one or more components. For example, the computing device 1800 may not include a display device 1812, but may include display device interface circuitry (e.g., a connector and driver circuitry) to which a display device 1812 may be coupled. In another set of examples, the computing device 1800 may not include an audio input device 1816 or an audio output device 1814, but may include audio input or output device interface circuitry (e.g., connectors and supporting circuitry) to which an audio input device 1816 or audio output device 1814 may be coupled.

The computing device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random-access memory (STT-MRAM).

In some embodiments, the computing device 1800 may include a communication chip 1806 (e.g., one or more communication chips). For example, the communication chip 1806 may be configured for managing wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1806 may implement any of a number of wireless standards or protocols, including but not limited to Institute for Electrical and Electronic Engineers (IEEE) standards including Wi-Fi (IEEE 1402.11 family), IEEE 1402.18 standards (e.g., IEEE 1402.18-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 1402.18 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 1402.18 standards. The communication chip 1806 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1806 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1806 may operate in accordance with other wireless protocols in other embodiments. The computing device 1800 may include an antenna 1808 to facilitate wireless communications and/or to receive other wireless communications (such as AM or FM radio transmissions).

In some embodiments, the communication chip 1806 may manage wired communications, such as electrical, optical, or any other suitable communication protocols (e.g., the Ethernet). As noted above, the communication chip 1806 may include multiple communication chips. For instance, a first communication chip 1806 may be dedicated to shorter-range wireless communications such as Wi-Fi or Bluetooth, and a second communication chip 1806 may be dedicated to longer-range wireless communications such as GPS, EDGE, GPRS, CDMA, WiMAX, LTE, EV-DO, or others. In some embodiments, a first communication chip 1806 may be dedicated to wireless communications, and a second communication chip 1806 may be dedicated to wired communications.

The computing device 1800 may include a battery/power circuitry 1810. The battery/power circuitry 1810 may include one or more energy storage devices (e.g., batteries or capacitors) and/or circuitry for coupling components of the computing device 1800 to an energy source separate from the computing device 1800 (e.g., AC line power).

The computing device 1800 may include a display device 1812 (or corresponding interface circuitry, as discussed above). The display device 1812 may include any visual indicators, such as a heads-up display, a computer monitor, a projector, a touchscreen display, a liquid crystal display (LCD), a light-emitting diode display, or a flat panel display, for example.

The computing device 1800 may include an audio output device 1814 (or corresponding interface circuitry, as discussed above). The audio output device 1814 may include any device that generates an audible indicator, such as speakers, headsets, or earbuds, for example.

The computing device 1800 may include an audio input device 1816 (or corresponding interface circuitry, as discussed above). The audio input device 1816 may include any device that generates a signal representative of a sound, such as microphones, microphone arrays, or digital instruments (e.g., instruments having a musical instrument digital interface (MIDI) output).

The computing device 1800 may include another output device 1818 (or corresponding interface circuitry, as discussed above). Examples of the other output device 1818 may include an audio codec, a video codec, a printer, a wired or wireless transmitter for providing information to other devices, or an additional storage device.

The computing device 1800 may include another input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1800 may include a global positioning system (GPS) device 1822 (or corresponding interface circuitry, as discussed above). The GPS device 1822 may be in communication with a satellite-based system and may receive a location of the computing device 1800, as known in the art.

The computing device 1800 may include a security interface device 1824. The security interface device 1824 may include any device that provides security features for the computing device 1800 or for any individual components therein (e.g., for the processing device 1802 or for the memory 1804). Examples of security features may include authorization, access to digital certificates, access to items in keychains, etc. Examples of the security interface device 1824 may include a software firewall, a hardware firewall, an antivirus, a content filtering device, or an intrusion detection device.

In some embodiments, the computing device 1800 may include a temperature detection device 1826 and a temperature regulation device 1828.

The temperature detection device 1826 may include any device capable of determining temperatures of the computing device 1800 or of any individual components therein (e.g., temperatures of the processing device 1802 or of the memory 1804). In various embodiments, the temperature detection device 1826 may be configured to determine temperatures of an object (e.g., the computing device 1800, components of the computing device 1800, devices coupled to the computing device, etc.), temperatures of an environment (e.g., a data center that includes, is controlled by, or otherwise associated with the computing device 1800), and so on. The temperature detection device 1826 may include one or more temperature sensors. Different temperature sensors of the temperature detection device 1826 may have different locations within and around the computing device 1800. A temperature sensor may generate data (e.g., digital data) representing detected temperatures and provide the data to another device, e.g., to the temperature regulation device 1828, the processing device 1802, the memory 1804, etc. In some embodiments, a temperature sensor of the temperature detection device 1826 may be turned on or off, e.g., by the processing device 1802 or an external system. The temperature sensor detects temperatures when it is on and does not detect temperatures when it is off. In other embodiments, a temperature sensor of the temperature detection device 1826 may detect temperatures continuously and automatically or detect temperatures at predefined times or at times triggered by an event associated with the computing device 1800 or any components therein.

The temperature regulation device 1828 may include any device configured to change (e.g., decrease) temperatures, e.g., based on one or more target temperatures and/or based on temperature measurements performed by the temperature detection device 1826. A target temperature may be a preferred temperature. A target temperature may depend on a setting in which the computing device 1800 operates. In some embodiments, the target temperature may be 200 Kelvin degrees or lower. In some embodiments, the target temperature may be 20 Kelvin degrees or lower, or 5 Kelvin degrees or lower. Target temperatures for different objects and different environments of, or associated with, the computing device 1800 can be different. In some embodiments, cooling provided by the temperature regulation device 1828 may be a multi-stage process with temperatures ranging from room temperature to 4K or lower.

In some embodiments, the temperature regulation device 1828 may include one or more cooling devices. Different cooling device may have different locations within and around the computing device 1800. A cooling device of the temperature regulation device 1828 may be associated with one or more temperature sensors of the temperature detection device 1826 and may be configured to operate based on temperatures detected the temperature sensors. For instance, a cooling device may be configured to determine whether a detected ambient temperature is above the target temperature or whether the detected ambient temperature is higher than the target temperature by a predetermined value or determine whether any other temperature-related condition associated with the temperature of the computing device 1800 is satisfied. In response to determining that one or more temperature-related condition associated with the temperature of the computing device 1800 are satisfied (e.g., in response to determining that the detected ambient temperature is above the target temperature), a cooling device may trigger its cooling mechanism and start to decrease the ambient temperature. Otherwise, the cooling device does not trigger any cooling. A cooling device of the temperature regulation device 1828 may operate with various cooling mechanisms, such as evaporation cooling, radiation cooling, conduction cooling, convection cooling, other cooling mechanisms, or any combination thereof. A cooling device of the temperature regulation device 1828 may include a cooling agent, such as a water, oil, liquid nitrogen, liquid helium, etc. In some embodiments, the temperature regulation device 1828 may be, for example, a dilution refrigerator, a helium-3 refrigerator, or a liquid helium refrigerator. In some embodiments, the temperature regulation device 1828 or any portions thereof (e.g., one or more of the individual cooling devices) may be connected to the computing device 1800 in close proximity (e.g., less than about 1 meter) or may be provided in a separate enclosure where a dedicated heat exchanger (e.g., a compressor, a heating, ventilation, and air conditioning (HVAC) system, liquid helium, liquid nitrogen, etc.) may reside.

By maintaining the target temperatures, the energy consumption of the computing device 1800 (or components thereof) can be reduced, while the computing efficiency may be improved. For example, when the computing device 1800 (or components thereof) operates at lower temperatures, energy dissipation (e.g., heat dissipation) may be reduced. Further, energy consumed by semiconductor components (e.g., energy needed for switching transistors of any of the components of the computing device 1800) can also be reduced. Various semiconductor materials may have lower resistivity and/or higher mobility at lower temperatures. That way, the electrical current per unit supply voltage may be increased by lowering temperatures. Conversely, for the same current that would be needed, the supply voltage may be lowered by lowering temperatures. As energy correlates to the supply voltage, the energy consumption of the semiconductor components may lower too. In some implementations, the energy savings due to reducing heat dissipation and reducing energy consumed by semiconductor components of the computing device or components thereof may outweigh (sometimes significantly outweigh) the costs associated with energy needed for cooling.

The computing device 1800 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1800 may be any other electronic device that processes data.

Figure 14:
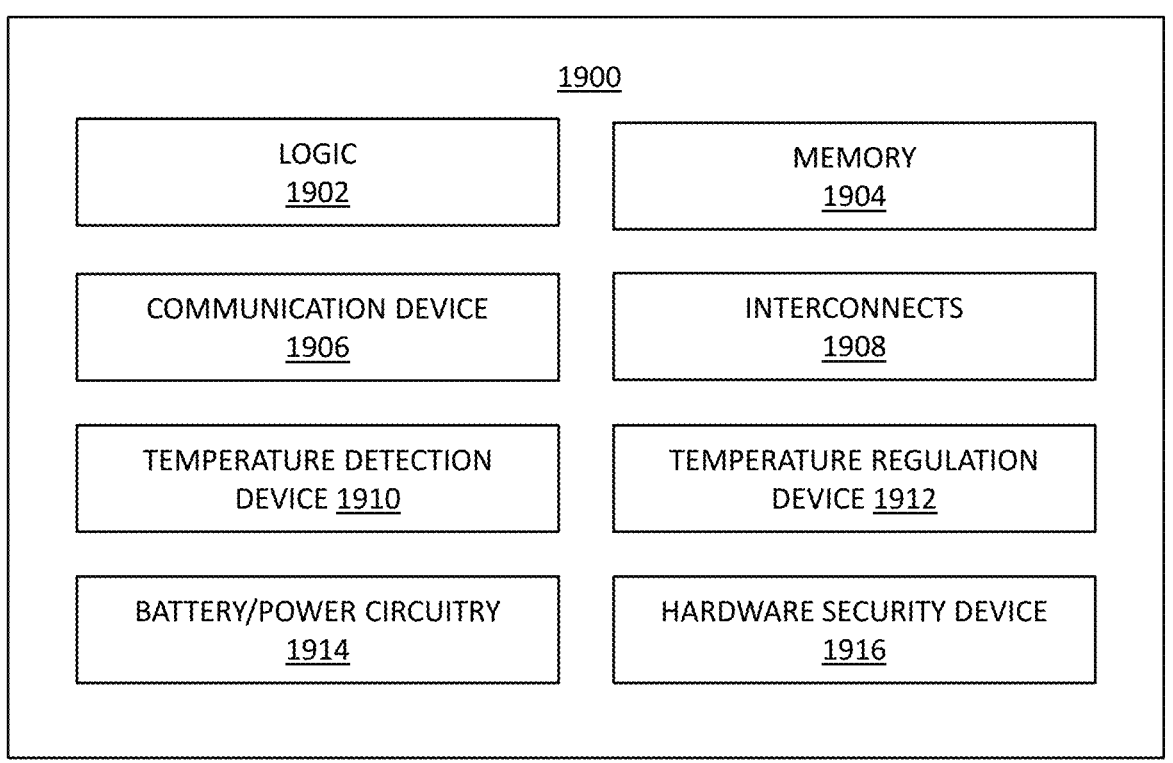
FIG. 14 is a block diagram of an example processing device that may include one or more stacked memory devices with a cooling system in accordance with any of the embodiments disclosed herein.

FIG. 14 is a block diagram of an example processing device 1900 that may include one or more stacked memory devices with a cooling system in accordance with any of the embodiments disclosed herein. For example, any suitable ones of the components of the processing device 1900 may include a die (e.g., the die 1502 (FIG. 10B)) having one or more stacked memory devices with a cooling system. Any one or more of the components of the processing device 1900 may include, or be included in, an IC device 1600 (FIG. 11). Any one or more of the components of the processing device 1900 may include, or be included in, an IC device assembly 1700 (FIG. 12). Any one or more of the components of the processing device 1900 may include, or be included in, a computing device 1800 (FIG. 13); for example, the processing device 1900 may be the processing device 1802 of the computing device 1800.

A number of components are illustrated in FIG. 14 as included in the processing device 1900, but any one or more of these components may be omitted or duplicated, as suitable for the application. In some embodiments, some or all of the components included in the processing device 1900 may be attached to one or more motherboards. In some embodiments, some or all of these components are fabricated on a single SoC die or coupled to a single support structure, e.g., to a single carrier substrate.

Additionally, in various embodiments, the processing device 1900 may not include one or more of the components illustrated in FIG. 14, but the processing device 1900 may include interface circuitry for coupling to the one or more components. For example, the processing device 1900 may not include a memory 1904, but may include display device interface circuitry (e.g., a connector and driver circuitry) to which a memory 1904 may be coupled.

The processing device 1900 may include logic circuitry 1902 (e.g., one or more circuits configured to implement logic/compute functionality). Examples of such circuits include ICs implementing one or more of input/output (I/O) functions, arithmetic operations, pipelining of data, etc.

In some embodiments, the logic circuitry 1902 may include one or more circuits responsible for read/write operations with respect to the data stored in the memory 1904. To that end, the logic circuitry 1902 may include one or more I/O ICs configured to control access to data stored in the memory 1904.

In some embodiments, the logic circuitry 1902 may include one or more high-performance compute dies, configured to perform various operations with respect to data stored in the memory 1904 (e.g., arithmetic and logic operations, pipelining of data from one or more memory dies of the memory 1904, and possibly also data from external devices/chips). In some embodiments, the logic circuitry 1902 may be configured to only control I/O access to data but not perform any operations on the data. In some embodiments, the logic circuitry 1902 may implement ICs configured to implement I/O control of data stored in the memory 1904, assemble data from the memory 1904 for transport (e.g., transport over a central bus) to devices/chips that are either internal or external to the processing device 1900, etc. In some embodiments, the logic circuitry 1902 may not be configured to perform any operations on the data besides I/O and assembling for transport to the memory 1904.

The processing device 1900 may include a memory 1904, which may include one or more ICs configure to implement memory circuitry (e.g., ICs implementing one or more of memory devices, memory arrays, control logic configured to control the memory devices and arrays, etc.). In some embodiments, the memory 1904 may be implemented substantially as described above with reference to the memory 1804 (FIG. 13). In some embodiments, the memory 1904 may be a designated device configured to provide storage functionality for the components of the processing device 1900 (i.e., local), while the memory 1804 may be configured to provide system-level storage functionality for the entire computing device 1800 (i.e., global). In some embodiments, the memory 1904 may include memory that shares a die with the logic circuitry 1902.

In some embodiments, the memory 1904 may include a flat memory (also sometimes referred to as a "flat hierarchy memory" or a "linear memory") and, therefore, may also be referred to as a "basin memory." As known in the art, a flat memory or a linear memory refers to a memory addressing paradigm in which memory may appear to the program as a single contiguous address space, where a processor can directly and linearly address all of the available memory locations without having to resort to memory segmentation or paging schemes. Thus, the memory implemented in the memory 1904 may be a memory that is not divided into hierarchical layer or levels in terms of access of its data.

In some embodiments, the memory 1904 may include a hierarchical memory. In this context, hierarchical memory refers to the concept of computer architecture where computer storage is separated into a hierarchy based on features of memory such as response time, complexity, capacity, performance, and controlling technology. Designing for high performance may require considering the restrictions of the memory hierarchy, i.e., the size and capabilities of each component. With hierarchical memory, each of the various memory components can be viewed as part of a hierarchy of memories ($m_1$, $m_2$, . . . $m_n$) in which each member $m_i$ is typically smaller and faster than the next highest member $m_{i+1}$ of the hierarchy. To limit waiting by higher levels, a lower level of a hierarchical memory structure may respond by filling a buffer and then signaling for activating the transfer. For example, in some embodiments, the hierarchical memory implemented in the memory 1904 may be separated into four major storage levels: 1) internal storage (e.g., processor registers and cache), 2) main memory (e.g., the system RAM and controller cards), and 3) on-line mass storage (e.g., secondary storage), and 4) off-line bulk storage (e.g., tertiary, and off-line storage). However, as the number of levels in the memory hierarchy and the performance at each level has increased over time and is likely to continue to increase in the future, this example hierarchical division provides only one non-limiting example of how the memory 1904 may be arranged.

The processing device 1900 may include a communication device 1906, which may be implemented substantially as described above with reference to the communication chip 1806 (FIG. 13). In some embodiments, the communication device 1906 may be a designated device configured to provide communication functionality for the components of the processing device 1900 (i.e., local), while the communication chip 1806 may be configured to provide system-level communication functionality for the entire computing device 1800 (i.e., global).

The processing device 1900 may include interconnects 1908, which may include any element or device that includes an electrically conductive material for providing electrical connectivity to one or more components of, or associated with, a processing device 1900 or/and between various such components. Examples of the interconnects 1908 include conductive lines/wires (also sometimes referred to as "lines" or "metal lines" or "trenches") and conductive vias (also sometimes referred to as "vias" or "metal vias"), metallization stacks, redistribution layers, metal-insulator-metal (MIM) structures, etc.

The processing device 1900 may include a temperature detection device 1910 which may be implemented substantially as described above with reference to the temperature detection device 1826 (FIG. 13) but configured to determine temperatures on a more local scale, i.e., of the processing device 1900 of components thereof. In some embodiments, the temperature detection device 1910 may be a designated device configured to provide temperature detection functionality for the components of the processing device 1900 (i.e., local), while the temperature detection device 1826 may be configured to provide system-level temperature detection functionality for the entire computing device 1800 (i.e., global).

The processing device 1900 may include a temperature regulation device 1912 which may be implemented substantially as described above with reference to the temperature regulation device 1828 (FIG. 13) but configured to regulate temperatures on a more local scale, i.e., of the processing device 1900 of components thereof. In some embodiments, the temperature regulation device 1912 may be a designated device configured to provide temperature regulation functionality for the components of the processing device 1900 (i.e., local), while the temperature regulation device 1828 may be configured to provide system-level temperature regulation functionality for the entire computing device 1800 (i.e., global).

The processing device 1900 may include a battery/power circuitry 1914 which may be implemented substantially as described above with reference to the battery/power circuitry 1810 (FIG. 13). In some embodiments, the battery/power circuitry 1914 may be a designated device configured to provide battery/power functionality for the components of the processing device 1900 (i.e., local), while the battery/power circuitry 1810 may be configured to provide system-level battery/power functionality for the entire computing device 1800 (i.e., global).

The processing device 1900 may include a hardware security device 1918 which may be implemented substantially as described above with reference to the security interface device 1824 (FIG. 13). In some embodiments, the hardware security device 1918 may be a physical computing device configured to safeguard and manage digital keys, perform encryption and decryption functions for digital signatures, authentication, and other cryptographic functions. In some embodiments, the hardware security device 1918 may include one or more secure cryptoprocessors chips.

SELECT EXAMPLES

The following paragraphs provide various examples of the embodiments disclosed herein.

Example 1 provides a memory device including a memory array including a plurality of bitcells; a thermal interface layer in thermal contact with the memory array; a cooling device; and a via coupled between the cooling device and a thermal interface layer.

Example 2 provides the memory device of example 1, where the memory array is a first memory array in a memory layer, the memory layer further including a second memory array, where the thermal interface layer is further in thermal contact with the second memory array.

Example 3 provides the memory device of example 1, where the memory array is a first memory array in a first memory layer, the memory device further including a second memory layer, the second memory layer including a second memory array.

Example 4 provides the memory device of example 3, further including a thermal insulator layer, the thermal insulator layer thermally isolating the second memory layer from the thermal interface layer.

Example 5 provides the memory device of example 3, further including a thermal insulator layer, the thermal insulator layer thermally isolating the second memory layer from the cooling device.

Example 6 provides the memory device of example 3, where the second memory layer is between the first memory layer and the cooling device, and the via coupled between the cooling device and the thermal interface layer extends through the second memory layer.

Example 7 provides the memory device of example 6, where the second memory layer further includes a third memory array, and the via is between the second memory array and the third memory array.

Example 8 provides the memory device of example 7, where the first memory array is arranged over the via, and the first memory array is offset from the second and third memory arrays in a direction parallel to a plane of a support structure.

Example 9 provides the memory device of any of the preceding examples, further including a plurality of peripheral devices coupled to the memory array.

Example 10 provides the memory device of example 9, where the plurality of peripheral devices are in a first layer of the memory device, and the memory array is in a second layer of the memory device, the memory device further including a via coupling the first layer to the second layer.

Example 11 provides the memory device of any of the preceding examples, where one bitcell of the memory array includes a plurality of transistors forming a static random-access memory (SRAM) cell.

Example 12 provides the memory device of any of the preceding examples, further including a logic layer including a plurality of transistors; and a second via coupled between the logic layer and the memory array.

Example 13 provides the memory device of example 12, where the second via extends through the thermal interface layer.

Example 14 provides an IC device including a support structure; a memory array including a plurality of bitcells, the memory array over the support structure; and a cooling structure formed around the support structure and the memory array, the cooling structure in thermal contact with the memory array.

Example 15 provides the IC device of example 14, where the cooling structure is coupled to a cooling device on a cooling package, the cooling package separate from the IC device.

Example 16 provides the IC device of example 15, where the cooling device includes a direct refrigerant.

Example 17 provides the IC device of example 15, where the cooling device includes a heat exchanger.

Example 18 provides the IC device of example 14, where the cooling structure is coupled to a cooling device, the cooling device over the support structure.

Example 19 provides the IC device of example 18, where the cooling structure includes a thermoelectric cooler.

Example 20 provides the IC device of any of examples 14-19, where the cooling structure includes a liquid coolant, the liquid coolant surrounding at least a portion of the memory array and the support structure.

Example 21 provides the IC device of any of examples 14-20, further including a plurality of peripheral devices coupled to the memory array.

Example 22 provides the IC device of example 21, where the plurality of peripheral devices are in a first layer of the IC device, and the memory array is in a second layer of the IC device, the IC device further including a via coupling the first layer to the second layer.

Example 23 provides the IC device of any of examples 14 through 22, where the memory array is in a first memory layer, the IC device further including a second memory array in a second memory layer.

Example 24 provides the IC device of any of examples 14 through 23, where the memory array is in a memory layer, the IC device further including a logic layer; and a via coupled between the logic layer and the memory layer.

Example 25 provides an IC device including a first memory layer including a first memory array; a second memory layer including a second memory array; a cooling device; a first thermal interface layer in thermal contact with the cooling device and the first memory layer; and a second thermal interface layer in thermal contact with the cooling device and the second memory layer.

Example 26 provides the IC device of example 25, further including a via thermally coupling the cooling device to the first thermal interface layer.

Example 27 provides the IC device of example 26, where the via further thermally couples the cooling device to the second thermal interface layer.

Example 28 provides the IC device of example 26, further including a second via thermally coupling the cooling device to the second thermal interface layer.

Example 29 provides the IC device of any of examples 25-28, where the first memory layer is over the first thermal interface layer, the second memory layer is over the first memory layer, and the second thermal interface layer is over the second memory layer.

Example 30 provides the IC device of example 29, further including a third thermal interface layer between the first memory layer and the second memory layer.

Example 31 provides the IC device of any of examples 25-30, further including a plurality of peripheral devices coupled to the first memory array.

Example 32 provides the IC device of example 31, where the plurality of peripheral devices are in a third layer of the memory device, the memory device further including a via coupling the first layer to the third layer.

Example 33 provides the IC device of any of examples 25-32, where one bitcell of the first memory array includes a plurality of transistors forming a SRAM cell.

Example 34 provides the IC device of any of examples 25-33, further including a logic layer including a plurality of transistors; and a signal via coupled between the logic layer and the second memory layer.

Example 35 provides the IC device of example 34, where the signal via extends through the first thermal interface layer.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. A memory device comprising:
a logic layer comprising a plurality of transistors;
a memory array comprising a plurality of bitcells;
a thermal interface layer in thermal contact with the memory array;
an active cooling device;
a first via coupled between the active cooling device and the thermal interface layer; and
a second via coupled between the logic layer and the memory array, wherein the second via extends through the thermal interface layer.

2. The memory device of claim 1, wherein the memory array is a first memory array in a memory layer, the memory layer further comprising a second memory array, wherein the thermal interface layer is further in thermal contact with the second memory array.

3. The memory device of claim 1, wherein the memory array is a first memory array in a first memory layer, the memory device further comprising a second memory layer, the second memory layer comprising a second memory array.

4. The memory device of claim 3, further comprising a thermal insulator layer, the thermal insulator layer thermally isolating the second memory layer from one of the thermal interface layer and the active cooling device.

5. The memory device of claim 3, wherein the second memory layer is between the first memory layer and the active cooling device, and the first via coupled between the active cooling device and the thermal interface layer extends through the second memory layer.

6. The memory device of claim 5, wherein the second memory layer further comprises a third memory array, and the first via is between the second memory array and the third memory array.

7. The memory device of claim 1, further comprising a plurality of peripheral devices coupled to the memory array, wherein the plurality of peripheral devices are in a first layer of the memory device, and the memory array is in a second layer of the memory device, the memory device further comprising a second via coupling the first layer to the second layer.

8. The memory device of claim 1, wherein the active cooling device is a refrigeration device.

9. The memory device of claim 1, wherein the active cooling device comprises a fluid coolant material.

10. The memory device of claim 1, wherein the logic layer is over a support structure, the thermal interface layer over the logic layer, and the memory array is over the thermal interface layer.

11. An integrated circuit (IC) device comprising:
a substrate;
a memory array comprising a plurality of bitcells, the memory array over the substrate; and
a cooling structure formed around the substrate and the memory array, the cooling structure in thermal contact with the memory array, wherein the cooling structure comprises a liquid coolant surrounding at least a portion of the memory array and the substrate.

12. The IC device of claim 11, wherein the cooling structure is coupled to a cooling device on a cooling package, the cooling package separate from the IC device.

13. The IC device of claim 12, wherein the cooling device comprises a direct refrigerant.

14. The IC device of claim 12, wherein the cooling device comprises a heat exchanger.

15. The IC device of claim 11, wherein the cooling structure is coupled to a cooling device, the cooling device over the substrate.

16. An integrated circuit (IC) device comprising:
a first memory layer comprising a first memory array;
a second memory layer comprising a second memory array, the second memory layer directly over the first memory layer;
a cooling device;
a first thermal interface layer in thermal contact with the cooling device and the first memory layer; and
a second thermal interface layer in thermal contact with the cooling device and the second memory layer; and
a via coupling the second thermal interface layer to the cooling device, wherein the via extends through the second memory layer, the first memory layer, and the first thermal interface layer.

17. The IC device of claim 16, further comprising a second via thermally coupling the cooling device to the first thermal interface layer.

18. The IC device of claim 17, wherein the second via further thermally couples the cooling device to the second thermal interface layer.

19. The IC device of claim 16, further comprising a second via coupling the first memory layer to a logic layer, the second via extending through the first thermal interface layer.

20. The IC device of claim 16, further comprising a cooling layer, wherein the first thermal interface layer is coupled to the cooling layer by a plurality of cooling vias.

* * * * *